(12) United States Patent       (10) Patent No.:     US 12,484,424 B2
Huang et al.                          (45) Date of Patent:           Nov. 25, 2025

(54) ELECTRONIC DEVICE

(71) Applicant: Innolux Corporation, Miao-Li County (TW)

(72) Inventors: Hao-Jung Huang, Miao-Li County (TW); Chi-Liang Chang, Miao-Li County (TW); I-Ho Shen, Miao-Li County (TW); Ker-Yih Kao, Miao-Li County (TW); Yun-Sheng Chen, Miao-Li County (TW); Chiao-Chu Tsui, Miao-Li County (TW); Chih-Han Ma, Miao-Li County (TW); Shan-Shan Hsu, Miao-Li County (TW); Chia-Chieh Fan, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 747 days.

(21) Appl. No.: 17/849,701

(22) Filed: Jun. 27, 2022

(65) Prior Publication Data

US 2023/0025999 A1     Jan. 26, 2023

Related U.S. Application Data

(60) Provisional application No. 63/223,555, filed on Jul. 20, 2021.

(30) Foreign Application Priority Data

Apr. 1, 2022 (CN) .......................... 202210339780.7

(51) Int. Cl.
 *H10K 59/80* (2023.01)
 *H01L 25/075* (2006.01)
 (Continued)

(52) U.S. Cl.
 CPC ......... *H10K 59/8791* (2023.02); *H10H 29/24* (2025.01); *H01L 25/0753* (2013.01);
 (Continued)

(58) Field of Classification Search
 CPC ... H01L 25/0753; H01L 25/167; H10H 29/24; H10K 59/18
 See application file for complete search history.

(56) References Cited

U.S. PATENT DOCUMENTS 10,269,779 B2    4/2019 Lu
2020/0388636 A1* 12/2020 Yueh ................... H01L 25/0655
 (Continued)

FOREIGN PATENT DOCUMENTS

CN       203277490       11/2013
CN       112068367       12/2020
 (Continued)

OTHER PUBLICATIONS

"Office Action of Taiwan Counterpart Application", issued on Mar. 31, 2023, p. 1-p. 7.
 (Continued)

*Primary Examiner* — Daniel P Shook
(74) *Attorney, Agent, or Firm* — JCIPRNET

(57) ABSTRACT

An electronic device including an electronic unit and a functional unit is provided. The electronic unit includes a substrate, a plurality of semiconductor components, and a cover layer. The substrate has a plurality of first side surfaces. The semiconductor components are disposed on the substrate. The cover layer is disposed on the semiconductor components and has a plurality of second side surfaces. The functional unit is disposed on at least one of at least one of the first side surfaces and at least one of the second side surfaces.

19 Claims, 15 Drawing Sheets

(51) Int. Cl.
   *H01L 25/16* (2023.01)
   *H10H 29/24* (2025.01)
   *H10K 59/18* (2023.01)

(52) U.S. Cl.
   CPC ............ *H01L 25/167* (2013.01); *H10K 59/18* (2023.02); *H10K 59/879* (2023.02); *H10K 59/8792* (2023.02)

(56) References Cited

U.S. PATENT DOCUMENTS

| | | | |
|---|---|---|---|
| 2021/0202449 A1* | 7/2021 | Shin | H10H 20/8506 |
| 2021/0225997 A1 | 7/2021 | Tsai et al. | |

FOREIGN PATENT DOCUMENTS

| | | |
|---|---|---|
| CN | 212323026 | 1/2021 |
| CN | 112748816 | 5/2021 |
| TW | I455303 | 10/2014 |
| TW | 202141128 | 11/2021 |

OTHER PUBLICATIONS

"Office Action of China Counterpart Application", issued on Apr. 26, 2025, p. 1-p. 9.

* cited by examiner

ELECTRONIC DEVICE

CROSS-REFERENCE TO RELATED APPLICATION

This application claims the priority benefit of U.S. application Ser. No. 63/223,555, filed on Jul. 20, 2021, and China application serial no. 202210339780.7, filed on Apr. 1, 2022. The entirety of each of the above-mentioned patent applications is hereby incorporated by reference herein and made a part of this specification.

BACKGROUND

Technical Field

The disclosure relates to an electronic device.

Description of Related Art

It has been proposed to splice a plurality of splicing units to realize large-sized electronic devices. However, issues of inconsistent optical effects or accumulation of static electricity may arise at joints among the splicing units. Therefore, there are still opportunities for further enhancements of the structural design of the electronic device constituted by splicing the splicing units.

SUMMARY

According to an embodiment of the disclosure, an electronic device including an electronic unit and a functional unit is provided. The electronic unit includes a substrate, a plurality of semiconductor components, and a cover layer. The substrate has a plurality of first side surfaces. The semiconductor components are disposed on the substrate. The cover layer is disposed on the semiconductor components and has a plurality of second side surfaces. The functional unit is disposed on at least one of at least one of the first side surfaces and at least one of the second side surfaces.

According to an embodiment of the disclosure, an electronic device including an electronic unit is provided. The electronic unit includes a substrate, a plurality of semiconductor components, and a cover layer. The substrate has a plurality of first side surfaces. The semiconductor components are disposed on the substrate. The cover layer is disposed on the semiconductor components and has a plurality of second side surfaces. Here, at least one of the second side surfaces has a chamfer structure.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles provided in the disclosure.

DESCRIPTION OF THE EMBODIMENTS

Figure 1:
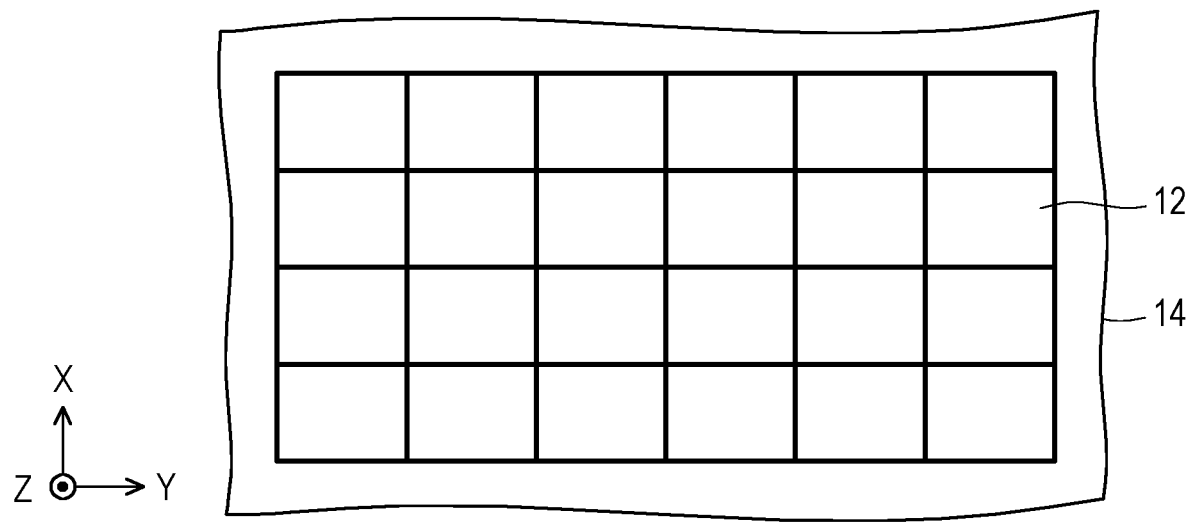
FIG. 1 is a schematic view of an electronic device according to an embodiment of the disclosure.

Certain words will be used to refer to specific devices throughout the specification and the appended claims of the disclosure. People skilled in the art should understand that manufacturers of electronic devices may refer to same components under different names. The disclosure does not intend to distinguish devices with the same functions but different names. In the following specification and claims, the terminologies "having", "including", etc. are open-ended terminologies, so they should be interpreted to mean "including but not limited to . . . ".

Directional terminologies mentioned herein, such as "top", "bottom", "front", "back", "left", "right", and so forth, refer to directions in the accompanying reference drawings. Accordingly, the directional terminologies provided herein serve to describe rather than limiting the disclosure. In the accompanying drawings, each figure illustrates methods applied in particular embodiments and general features of structures and/or materials in the embodiments. However, these figures should not be construed or defined as the scope covered by the particular embodiments. For instance, relative dimensions, thicknesses, and positions of various layers, regions, and/or structures may be reduced or enlarged for clarity.

A structure (or a layer, a device, a substrate) described in this disclosure is located on/above another structure (or another layer, another device, another substrate), which may mean that the two structures are adjacent and directly connected, or the two structures are close to each other but indirectly connected. Indirect connection means that there is at least one intervening structure (or an intervening layer, an intervening device, an intervening substrate, intervening space) between the two structures, a lower surface of one structure is adjacent to or directly connected to an upper surface of the intervening structure, and an upper surface of another structure is adjacent to or directly connected to a lower surface of the intervening structure. Here, the intervening structure may be constituted by a single-layer or multi-layer physical or non-physical structure, which should not be construed as a limitation in the disclosure. In this disclosure, when a structure is described as being "on" another structure, it may indicate that the structure is "directly" on or "indirectly" on another structure, i.e., there is at least one intervening structure between the structure and the another structure.

The terminologies such as "first", "second", etc. provided in the specification and the claims serve to modify devices and do not imply and represent any previous ordinal numbers of the devices, the order of certain device and another device, and the order of a manufacturing method. The use of these ordinal numbers merely serves to clearly distinguish one device with a certain name from another device with the same name. Different words may be used in the claims and the specifications, and thereby a first component in the specification may be a second component in the claims.

An electrical connection or coupling relationship described in this disclosure may refer to a direct connection or an indirect connection. In the case of the direct connection, end points of the components on two circuits are directly connected or connected to each other by a conductor segment, and in the case of the indirect connection, there are switches, diodes, capacitors, inductors, resistors, other appropriate components, or a combination of the above components between the end points of the components on the two circuits, which should not be construed as a limitation in the disclosure.

In this disclosure, measurement of thickness, length, and width may be done by applying an optical microscope, and the thickness or the width may be obtained by measuring a cross-sectional image in an electron microscope, which should not be construed as a limitation in the disclosure. In addition, certain errors between any two values or directions for comparison may be acceptable. Additionally, the terminologies "equal to", "equivalent to", "same", "substantially", or "approximately" are generally interpreted as being within 10% of a given value or range. Moreover, the descriptions "a given range is from a first value to a second value" and "a given range falls within a range from the first value to the second value" indicate that the given range includes the first value, the second value, and the intervening values. If a first direction is perpendicular to a second direction, an angle difference between the first direction and the second direction may be between 70 degrees and 110 degrees; if the first direction is parallel to the second direction, an angle difference between the first direction and the second direction may be between 0 degrees and 20 degrees.

It should be understood that the following embodiments may replace, reorganize, and mix the features in several different embodiments to complete other embodiments without departing from the spirit of the disclosure. As long as the features of the embodiments do not violate the spirit of the disclosure or conflict each other, they may be mixed and matched as desired.

Unless otherwise defined, all terminologies (including technical and scientific terminologies) used herein have the same meanings commonly understood by those having ordinary skill in the art. It is understandable that these terminologies, such as those defined in commonly used dictionaries, should be interpreted as having a meaning consistent with the relevant technology and the background or context of this disclosure, rather than being interpreted in an idealized or overly formal way, unless specifically defined here. In the disclosure, the electronic device may include but is not limited to a display device, a backlight device, an antenna device, a sensing device, or a splicing device. The electronic device may be a bendable or flexible electronic device. The display device may be a non-self-illuminating display device or a self-illuminating display device. The antenna device may be a liquid crystal type antenna device or a non-liquid crystal type antenna device, and the sensing device may sense capacitance, light, heat, or ultrasonic waves, which should however not be construed as a limitation in the disclosure. In this disclosure, the electronic device may include a passive device and an active device, such as a capacitor, a resistor, an inductor, a diode, a transistor, and the like. The diode may include a light emitting diode (LED) or a photodiode. The LED may include, for instance, an organic light emitting diode (OLED), a mini LED, a micro LED, or a quantum dot LED, which should however not be construed as a limitation in the disclosure. In the following description, the display device is applied as the electronic device or the splicing device to explain the disclosure, which should however not be construed as a limitation in the disclosure.

It should be noted that the technical schemes provided in the different embodiments hereinafter may be replaced, combined or mixed to constitute another embodiment without violating the spirit of the disclosure.

In some embodiments of the disclosure, unless specifically defined, terminologies related to bonding and connection such as "connected", "interconnected", etc. may mean that two structures are in direct contact, or that two structures are not in direct contact with other structures provided therebetween. The terminologies related to bonding and connection may also cover cases where two structures are both movable or two structures are both fixed. In addition, the terminology "coupling" includes the transfer of energy between two structures through direct or indirect electrical connection or the transfer of energy between two separate structures through mutual induction.

In the following embodiments, the same or similar components will be given the same or similar reference numbers, and repeated descriptions thereof will be omitted. In addition, features in different embodiments may be arbitrarily combined as long as they do not violate the spirit and the scope of protection provided in the disclosure, and simple equivalent changes and modifications made according to the description or the claims still fall within the scope of f protection provided in the disclosure. Besides, the terminologies "first", "second", and the like mentioned in this specification or claims serve to name different components or to distinguish different embodiments or ranges rather than limiting the maximum or minimum number of the components nor limiting the order of manufacture or arrangement of the components. In the accompanying drawings, the X, Y, and Z axes serve to represent the orientation of individual components and devices. In some embodiments, the X axis, the Y axis, and the Z axis are perpendicular to each other, which should however not be construed as a limitation in the disclosure. In some other embodiments, the X axis, the Y axis, and the Z axis may be three axes that intersect pairwise but are not necessarily perpendicular. In addition, terminologies such as first, second, third, etc. provided below are simply for the convenience of distinguishing a plurality of the same or similar components, features, and/or structures and do not limit the manufacturing sequence or stacking sequence of these components, features, and/or structures.

FIG. 1 is a schematic view of an electronic device according to an embodiment of the disclosure. An electronic product 10 includes a plurality of splicing units 12 adjacently arranged on a plane of an X axis and a Y axis. In some embodiments, the splicing units 12 may be disposed on a back plate 14 and are not overlapped. Each splicing unit 12 may be locked to, adhered to, or disposed on the back plate 14 in another manner. The spliced splicing units 12 may commonly display one single frame to provide a large-sized display frame. The number of the splicing units 12 may be determined according to the desired dimension, and hence the dimension of the electronic product 10 is not limited to the dimension of the individual splicing unit 12.

Figure 2:
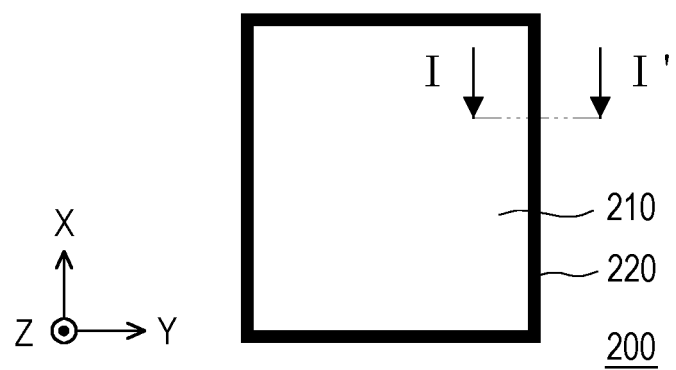
FIG. 2 is a schematic view of a portion of an electronic device according to an embodiment of the disclosure.

FIG. 2 is a schematic view of a portion of an electronic device 200 according to an embodiment of the disclosure. The electronic device 200 in FIG. 2 may be an implementation of a portion of the electronic product 10 in FIG. 1 (e.g., one single splicing unit), which should however not be construed as a limitation in the disclosure. The electronic device 200 may include an electronic unit 210 and a functional unit 220. The functional unit 22 may be disposed on at least one side of the electronic unit 210. In some embodiments, a plurality of the electronic devices 200 may act as the splicing units spliced to each other to constitute the electronic product 10 shown in FIG. 1, and the functional units 220 may surround the electronic units 210 and may be located between two adjacent electronic devices 200. The electronic unit 210 is configured to implement functions which should be provided by the electronic device 200, such as providing a light source, displaying images, and performing a touch sensing operation, and so forth. The functional unit 220 is located around the electronic unit 210, and in some embodiments the functional unit 220 has appropriate optical properties to improve the overall lighting and/or display effect of the electronic device 10. In some embodiments, the functional unit 220 may be disposed on at least one side of the electronic unit 210. For instance, if the electronic unit 210 has a rectangular profile, the functional unit 220 may be disposed along at least one side of the rectangular profile.

Figure 3A:
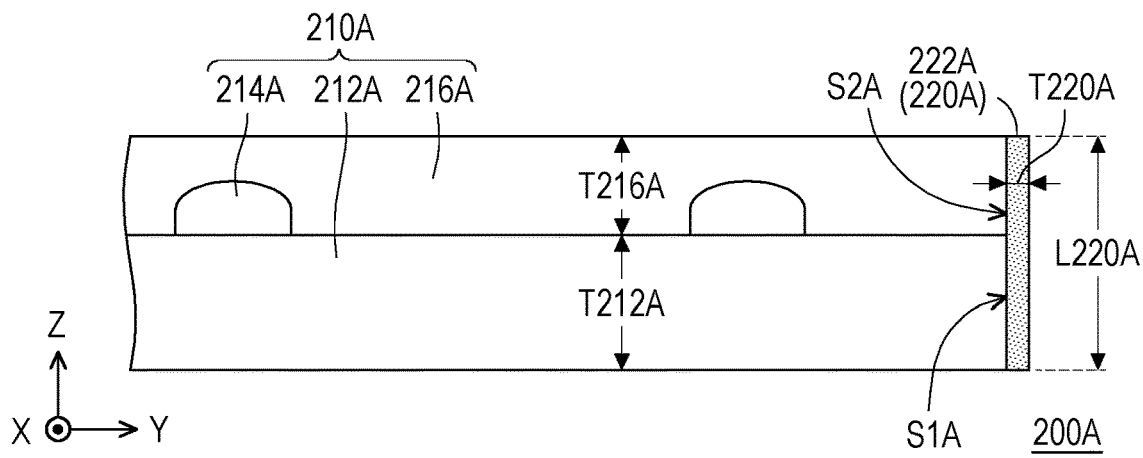
FIG. 3A to FIG. 3F are schematic cross-sectional views of a portion of the electronic device depicted in FIG. 2 along a line I-I' according to individual embodiments of the disclosure.

FIG. 3A to FIG. 3F are schematic cross-sectional views of a portion of the electronic device depicted in FIG. 2 along a line I-I' according to individual embodiments of the disclosure. Electronic devices 200A to 200F depicted in FIG. 3A to FIG. 3F may respectively represent a manner of implementing one of the splicing units 12 in FIG. 1. In FIG. 3A, the electronic device 200A includes an electronic unit 210A and a functional unit 220A. The electronic unit 210A includes a substrate 212A, a plurality of semiconductor components 214A, and a cover layer 216A. The semiconductor components 214A are disposed on the substrate 212A, and the cover layer 216A is disposed on the semiconductor components 214A. The substrate 212A has a plurality of first side surfaces, and the cover layer 216A has a plurality of second side surfaces. The cross-sectional structure depicted in FIG. 3A corresponds to the line I-I' in FIG. 2; hence, one of the first side surfaces S1A of the substrate 212A and one of the second side surfaces S2A of the cover layer 216A are shown for explanation. The functional unit 220A is disposed on the first side surface S1A and the second side surface S2A. In some embodiments, the functional unit 220A may be disposed on at least one (one or more) of at least one of the first side surfaces of the substrate 212A and at least one of the second side surfaces of the cover layer 216A. For instance, the functional unit 200A may be disposed simply on the first side surface S1A or disposed on simply the second side surface S2A.

In this embodiment, the functional unit 220A may directly contact the first side surface S1A and the second side surface S2A. The functional unit 220A may include a light modulation layer 222A, which may be configured to modulate light traveling to the periphery and/or the edge of the electronic device 200A. In some embodiments, the light modulation layer 222A in the functional unit 220A may be a non-transparent layer with a low light transmittance. For instance, the light modulation layer may be a black or gray light shielding layer, a reflection layer with reflective properties (e.g., a white reflection layer), a filter layer (e.g., a color filter layer), or other films with a low light transmittance. In this embodiment, an extension length L220A of the functional unit 220A in a thickness direction of the substrate 212A (e.g., a Z-axis direction) may be approximately equal to the sum of a thickness T212A of the substrate 212A and a thickness T216A of the cover layer 216A. In other embodiments, the extension length L220A may be less than the sum of the thickness T212A and the thickness T216A. In addition, the functional unit 220A may further include not only the light modulation layer but also other devices in some embodiments.

In some embodiments, the semiconductor components 214A may be a light emitting components. For instance, the semiconductor components 214A may be LEDs, such as OLEDs, mini LEDs, micro LEDs, or quantum dot LEDs. When light emitted by the semiconductor components 214A travels to at least one of the first side surface S1A and the second side surface S2A, a refraction or scattering phenomenon may occur, thus resulting in bright lines on the edge of the electronic device 200A. This may also be understood as an edge light leakage phenomenon. At this time, the light modulation layer 222A of the functional unit 220A with the light shielding effect may block the refracted or scattered light, which is conducive to reduction of the edge light leakage phenomenon of the electronic device 200A and improvement of the display quality and/or the illumination quality. When the electronic devices 200A are applied to the electronic product 10 as shown in FIG. 1, due to the functional units 220A, joints among the adjacent splicing units 12 (the electronic devices 200A) do not have the unexpected bright lines, which is conducive to the improvement of the overall display uniformity and display quality.

Figure 3B:
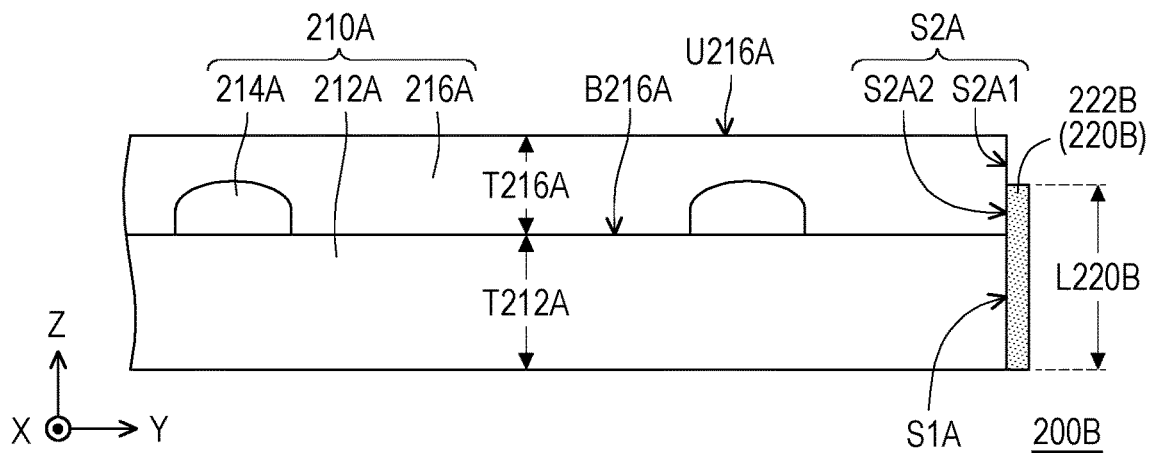

The electronic device 200B in FIG. 3B is substantially the same as the electronic device 200A in FIG. 3A, and thus the same reference numbers in these two embodiments represent the same components. The electronic device 200B includes the electronic unit 210A and a functional unit 220B, wherein the configuration of the functional unit 220B is different from that of the functional unit 220A in FIG. 3A. In this embodiment, the functional unit 220B is disposed on the first side surface S1A of the substrate 212A and on the second side surface S2A of the cover layer 216A. Meanwhile, an extension length L220B of the functional unit 220B in the thickness direction of the substrate 212A (the Z-axis direction) is less than the sum of the thickness T212A of the substrate 212A and the thickness T216A of the cover layer 216A. The cover layer 216A has an upper surface U216A and a lower surface B216A, a section S2A1 of the second side surface S2A of the cover layer 216A close to the upper surface U216A is not covered by the functional unit 220B, and a section S2A2 close to the lower surface B216A is covered by the functional unit 220B. The functional unit 220B includes a light modulation layer 222B whose material is similar to the that of the light modulation layer 222A. The light emitted by the semiconductor components 214A may be refracted and/or scattered when the light irradiates the section S2A1 of the second side surface S2A, and the light is blocked when it irradiates the section S2A2 of the second side surface S2A and the first side surface S1A. As such, a portion of the light may still be emitted from the side edge of the electronic device 200B, which is conducive to maintenance of a certain brightness at the side edge and improvement of overall brightness uniformity of the electronic device 200B.

Figure 3C:
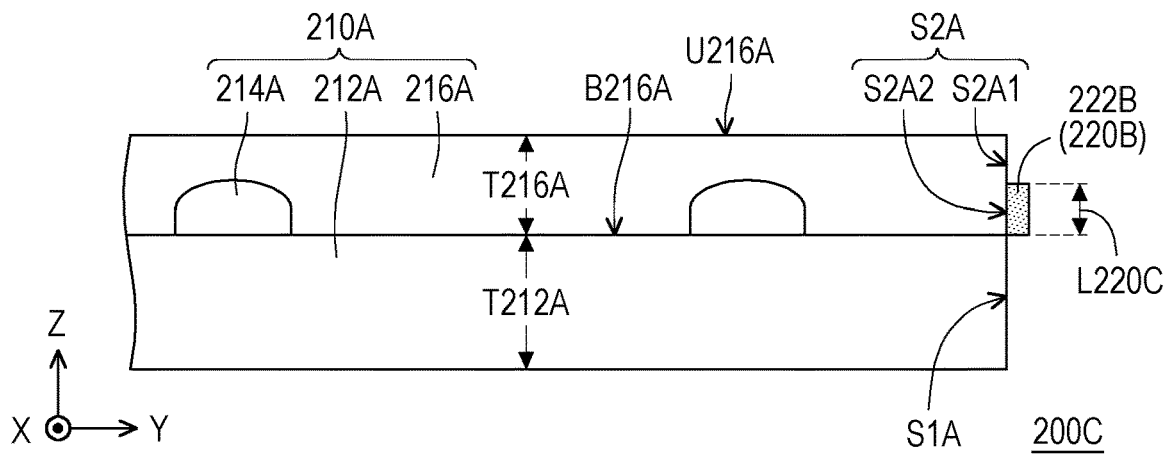

The electronic device 200C in FIG. 3C is substantially the same as the electronic device 200A in FIG. 3A, and thus the same reference numbers in these two embodiments represent the same components. Specifically, the electronic device 200C includes the electronic unit 210A and a functional unit 220C, wherein the configuration of the functional unit 220C is different from that of the functional unit 220A in FIG. 3A. In this embodiment, the functional unit 220C is disposed on the second side surface S2A of the cover layer 216A. The first side surface S1A of the substrate 212A is not covered by the functional unit 216A. Meanwhile, an extension length L220C of the functional unit 220B in the thickness direction of the substrate 212A is less than the thickness T216A of the cover layer 216A. The section S2A1 of the second side surface S2A of the cover layer 216A close to the upper surface U216A is not covered by the functional unit 220C, and the section S2A2 close to the lower surface B216A is covered by the functional unit 220C. The functional unit 220C includes a light modulation layer 222C, and the characteristics, the material, and other features of the light modulation layer 222C may be derived from those of the light modulation layer 222A in FIG. 3A.

Figure 3D:
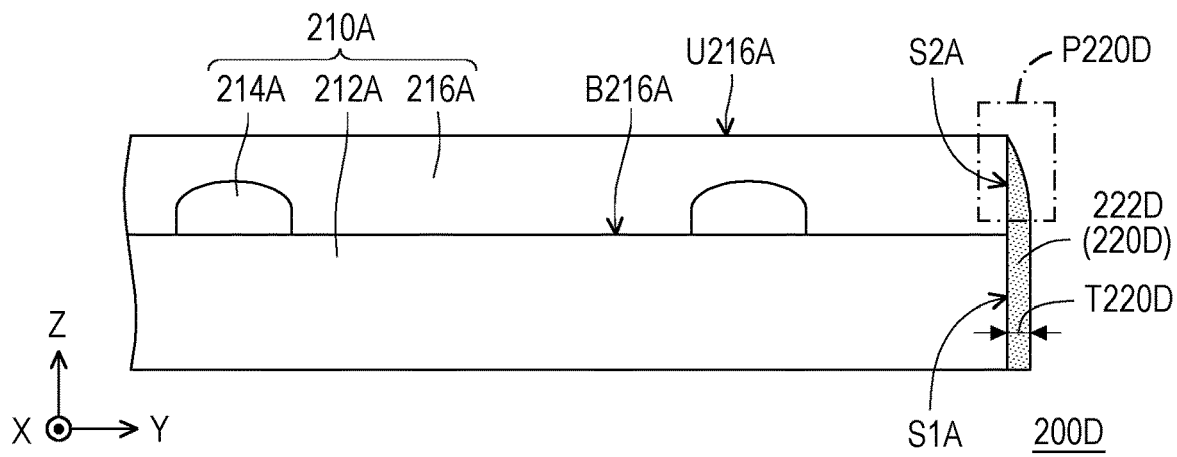

The electronic device 200D in FIG. 3D is substantially the same as the electronic device 200A in FIG. 3A, and thus the same reference numbers in these two embodiments represent the same components. Specifically, the electronic device 200D includes the electronic unit 210A and a functional unit 220D, wherein the shape of the functional unit 220D is different from that of the functional unit 220A in FIG. 3A. In this embodiment, the cover layer 216A has an upper surface U216A and a lower surface B216A. A thickness T220D of the functional unit 220D close to the upper surface U216A is less than a thickness T220D of the functional unit 220D close to the lower surface B216A. In other words, the functional unit 220D has a thinned portion P220D that is, as compared to the other portions, closer to the upper surface U216A. The functional unit 220D includes a light modulation layer 222D, and the characteristics, the material, and other features of the light modulation layer 222D may be derived from those of the light modulation layer 222A in FIG. 3A. The thinned portion P220D has a relatively high light transmittance than the other portions due to its relatively small thickness. Hence, when the light emitted by the semiconductor components 214A is transmitted to the second side surface S2A, a portion of the light may pass through the thinned portion P220D, which is conducive to maintenance of certain brightness at the edge of the electronic device 200D and improvement the brightness uniformity of the electronic device 200D. In some embodiments, the thinned portion P220D may have an arc-shaped surface or an inclined surface inclined relative to the second side surface S2A.

Figure 3E:
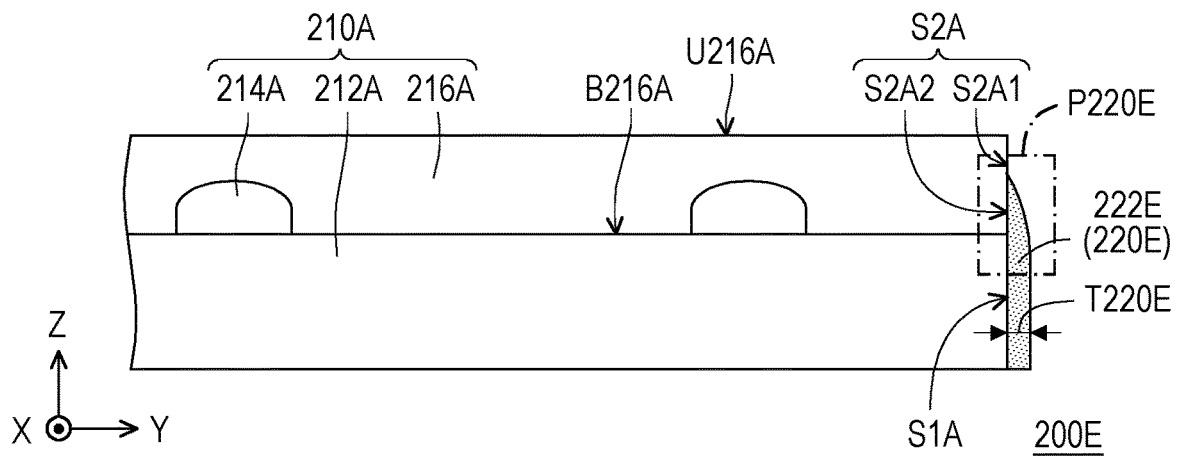

The electronic device 200E in FIG. 3E is substantially the same as the electronic device 200B in FIG. 3B, and thus the same reference numbers in these two embodiments represent the same components. Specifically, the electronic device 200E includes the electronic unit 210A and a functional unit 220E, wherein a shape of the functional unit 220E is different from that of the functional unit 220B in FIG. 3B. In this embodiment, the functional unit 220E has a thinned portion P220E that is, as compared to the other portions, closer to the upper surface U216A of the cover layer 216A. The functional unit 220E includes a light modulation layer 222E, and the characteristics, the material, and other features of the light modulation layer 222E may be derived from those of the light modulation layer 222A in FIG. 3A. The closer the functional unit 220E to the upper surface U216A of the cover layer 216A, the less the thickness T220E of the functional unit 220E. Thereby, not only the section S2A1 of the second side surface S2A of the cover layer 216A not covered by the functional unit 220E allows light to pass through, but also the section S2A2 covered by the thinned portion P220E may somehow allow light to pass through. Hence, the edge of the electronic device 200E may still have certain brightness, which is conducive to maintenance of ideal brightness uniformity.

Figure 3F:
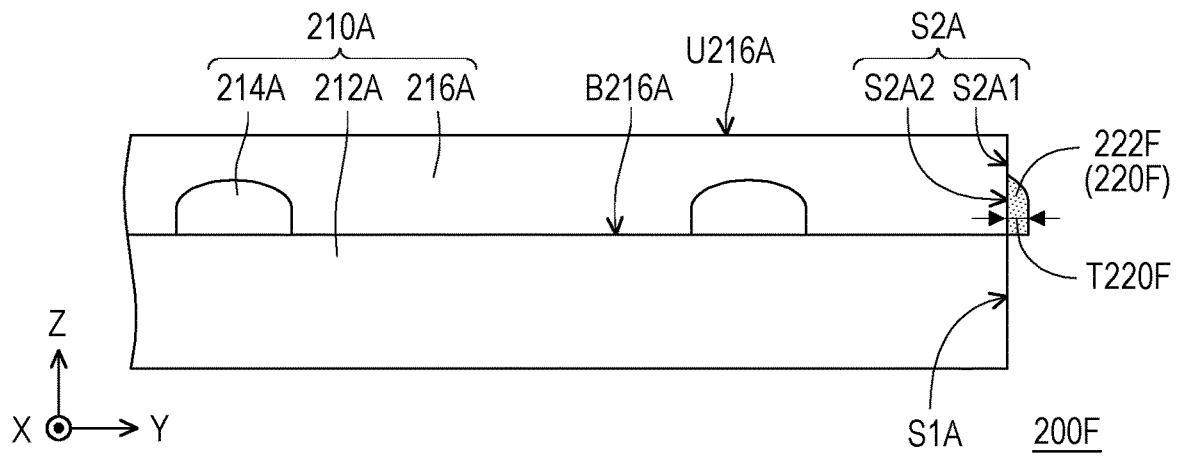

The electronic device 200F in FIG. 3F is substantially the same as the electronic device 200C in FIG. 3C, and thus the same reference numbers in these two embodiments represent the same components. Specifically, the electronic device 200F includes the electronic unit 210A and a functional unit 220F, wherein the shape of the functional unit 220F is different from that of the functional unit 220C in FIG. 3C. The functional unit 220F includes a light modulation layer 222F, and the characteristics, the material, and other features of the light modulation layer 222F may be derived from those of the light modulation layer 222A in FIG. 3A. In this embodiment, the functional unit 220F has a thinned portion P220F that is, as compared to the other portions, closer to the upper surface U216A of the cover layer 216A. For instance, the closer the functional unit 220F to the upper surface U216A of the cover layer 216A, the less the thickness T220F of the functional unit 220F. Thereby, not only the section S2A1 of the second side surface S2A of the cover layer 216A not covered by the functional unit 220F allows light to pass through, but also the section S2A2 covered by the thinned portion P220F may somehow allow light to pass through. Hence, the edge of the electronic device 200F may still have certain brightness, which is conducive to maintenance of ideal brightness uniformity.

In the above embodiments illustrated in FIG. 3A to FIG. 3F, the functional units 200A to 200F are in contact with at least one of the first side surface S1A and the second side surface S2A. In some embodiments, when the substrate 212A and the cover layer 216A are polygonal and respectively have a plurality of the first side surfaces S1A and a plurality of the second side surfaces S2A, the functional units 200A to 200F are in contact with at least one (one or more) of at least one of the first side surfaces S1A and at least one of the second side surfaces S2A.

FIG. 4A to FIG. 4F are schematic cross-sectional views of a portion of the electronic device depicted in FIG. 2 along the line I-I' according to individual embodiments of the disclosure. Electronic devices 300A to 300F depicted in FIG. 4A to FIG. 4F may respectively represent a manner of implementing one of the splicing units 12 in FIG. 1. The electronic devices 300A to 300F depicted in FIG. 4A to FIG. 4F are substantially similar to the electronic devices 200A to 200F depicted in FIG. 3A to FIG. 3F; hence, the same reference numbers in these embodiments represent the same components, and the features of the same or similar components may be cross-referenced. The electronic devices 300A to 300F depicted in FIG. 4A to FIG. 4F all include the electronic unit 210A, and the electronic unit 210A may include the substrate 212A, the semiconductor components 214A, and the cover layer 216A.

Figure 4A:
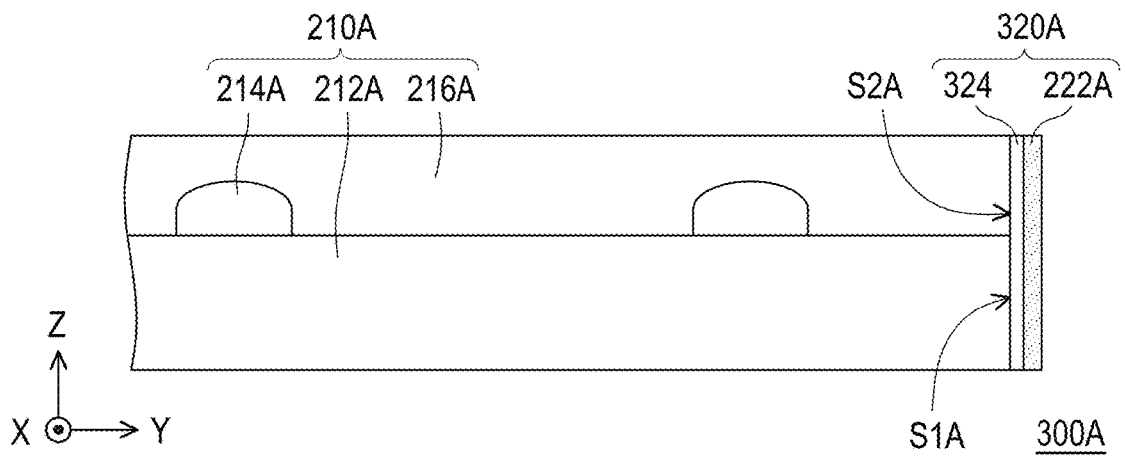
FIG. 4A to FIG. 4F are schematic cross-sectional views of a portion of the electronic device depicted in FIG. 2 along the line I-I' according to individual embodiments of the disclosure.

The electronic device 300A in FIG. 4A further includes a functional unit 320A, and the functional unit 320A includes the light modulation layer 222A and an anti-static layer 324. Specifically, the anti-static layer 324 may contact the first side surfaces S1A of the substrate 212A and the second side surfaces S2A of the cover layer 216A. The light modulation layer 222A is disposed on the anti-static layer 324. As such, the anti-static layer 324 is disposed between the light modulation layer 222A and the electronic unit 210A. In this embodiment, the structural features of the light modulation layer 222A, e.g., the extension length, are substantially the same as those of the functional unit 220A in FIG. 3A, and therefore the corresponding description of the functional unit 220A in FIG. 3A is applicable to the light modulation layer 222A.

Figure 4B:
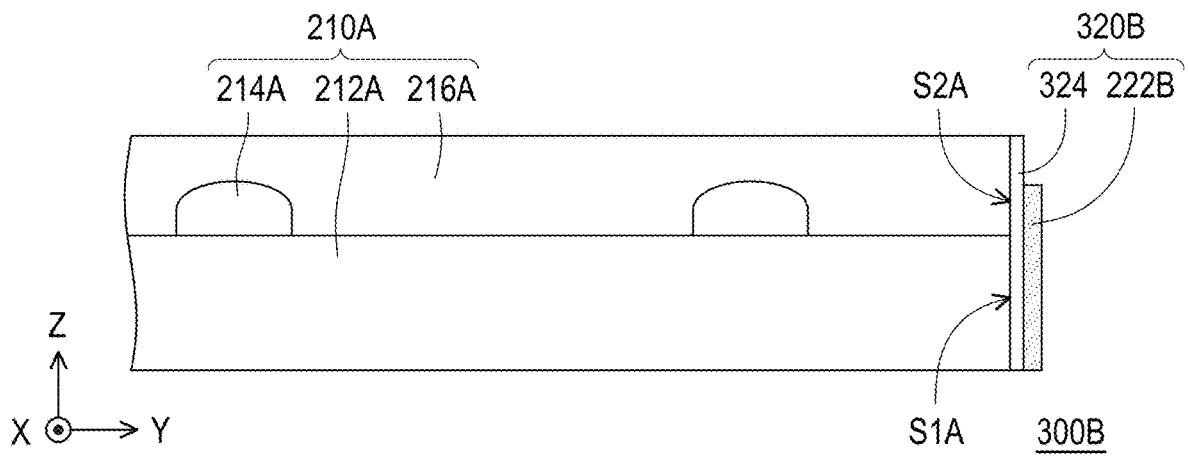

The electronic device 300B in FIG. 4B further includes a functional unit 320B, and the functional unit 320B includes the light modulation layer 222B and an anti-static layer 324. Specifically, the arrangement relationship between the anti-static layer 324 and the light modulation layer 222B may refer to the description as shown in FIG. 4A and thus will not be further explained. As such, the anti-static layer 324 is disposed between the light modulation layer 222B and the electronic unit 210A. In this embodiment, the structural features of the light modulation layer 222B, e.g., the extension length, are substantially the same as those of the functional unit 220B in FIG. 3B, and therefore the corresponding description of the functional unit 220B in FIG. 3B is applicable to the light modulation layer 222B.

Figure 4C:
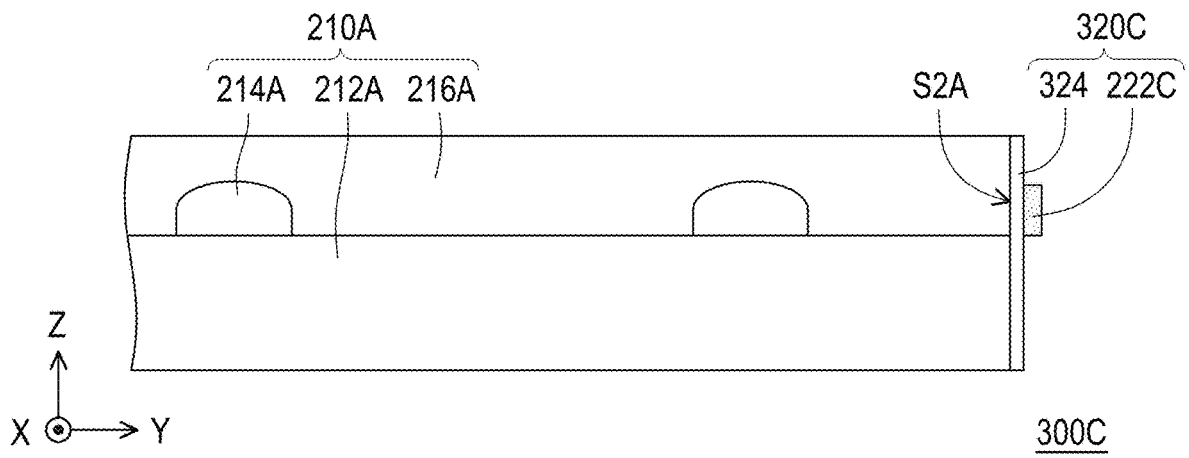

The electronic device 300C in FIG. 4C further includes a functional unit 320C, and the functional unit 320C includes the light modulation layer 222C and an anti-static layer 324. Specifically, the anti-static layer 324 is disposed between the light modulation layer 222C and the electronic unit 210A. In this embodiment, the structural features of the light modulation layer 222C, e.g., the extension length, are substantially the same as those of the functional unit 220C in FIG. 3C, and therefore the corresponding description of the functional unit 220C in FIG. 3C is applicable to the light modulation layer 222C.

Figure 4D:
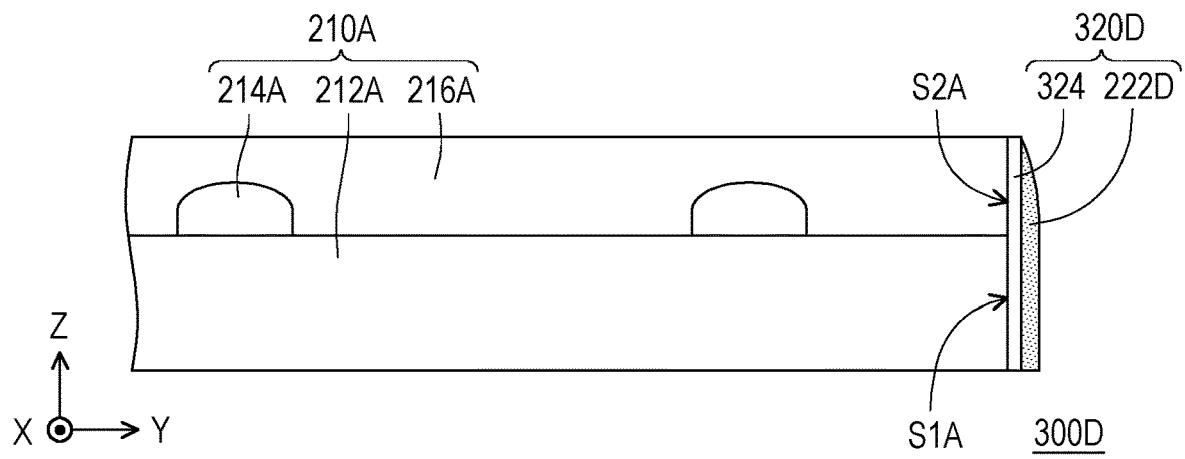

The electronic device 300D in FIG. 4D further includes a functional unit 320D, and the functional unit 320D includes the light modulation layer 222D and an anti-static layer 324. Specifically, the anti-static layer 324 is disposed between the light modulation layer 222D and the electronic unit 210A. In this embodiment, the structural features of the light modulation layer 222D, e.g., the extension length, are substantially the same as those of the functional unit 220D in FIG. 3D, and therefore the corresponding description of the functional unit 220D in FIG. 3D is applicable to the light modulation layer 222D.

Figure 4E:
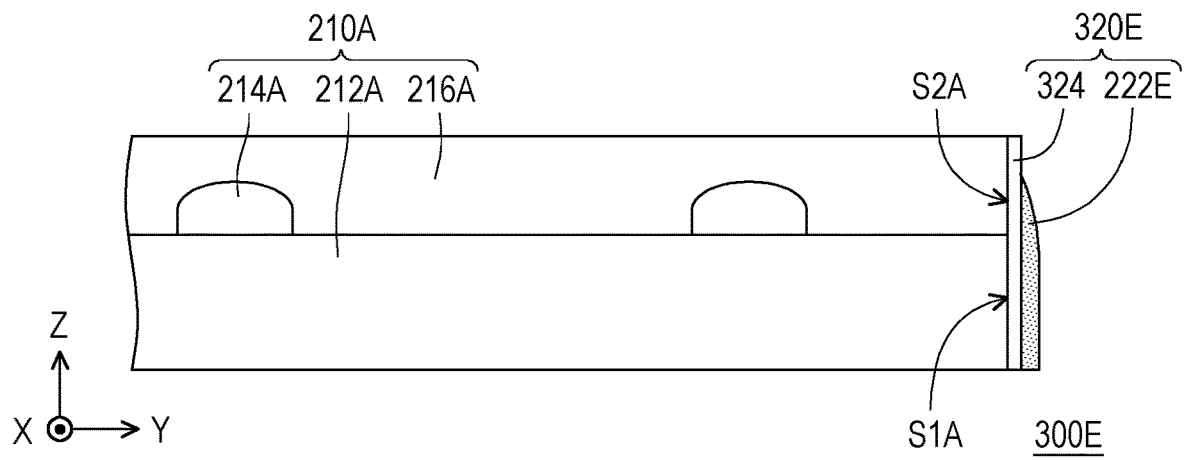

The electronic device 300E in FIG. 4E further includes a functional unit 320E, and the functional unit 320E includes the light modulation layer 222E and an anti-static layer 324. Specifically, the anti-static layer 324 is disposed between the light modulation layer 222E and the electronic unit 210A. In this embodiment, the structural features of the light modulation layer 222E, e.g., the extension length, are substantially the same as those of the functional unit 220E in FIG. 3E, and therefore the corresponding description of the functional unit 220E in FIG. 3E is applicable to the light modulation layer 222E.

Figure 4F:
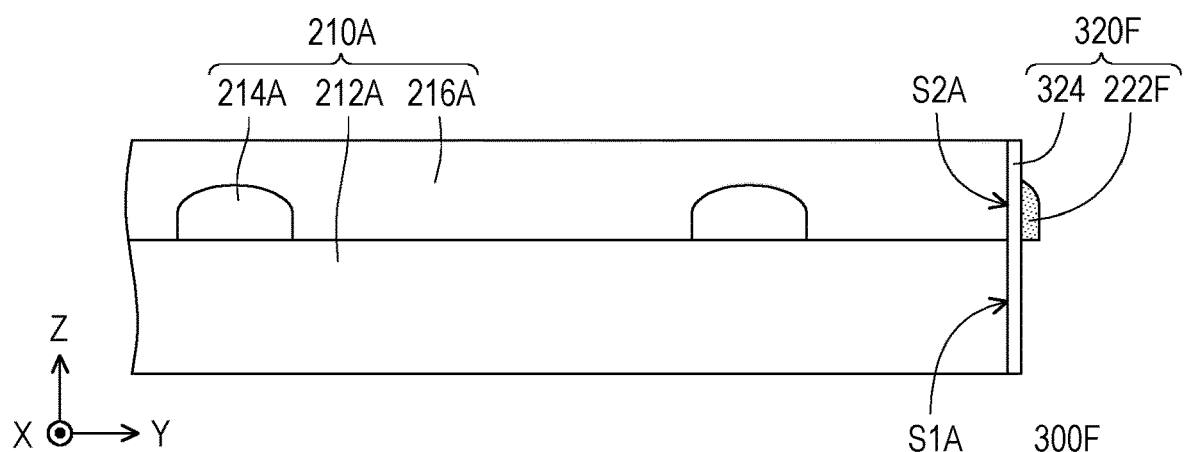

The electronic device 300F in FIG. 4F further includes a functional unit 320F, and the functional unit 320F includes the light modulation layer 222F and an anti-static layer 324. Specifically, the anti-static layer 324 is disposed between the light modulation layer 222F and the electronic unit 210A. In this embodiment, the structural features of the light modulation layer 222F, e.g., the extension length, are substantially the same as those of the functional unit 220F in FIG. 3F, and therefore the corresponding description of the functional unit 220F in FIG. 3F is applicable to the light modulation layer 222F.

The anti-static layer 324 described in FIG. 4A to FIG. 4F may be made of polytetrafluoroethylene (Teflon), high density polyethylene (HDPE), or other similar organic compounds. In some embodiments, the anti-static layer 324 may include appropriate particles, such as doped conductive particles, dielectric particles with sufficient dielectric strength, and so on. The light modulation layers 222A to 222F may include the materials of the functional units 220A to 220F provided in the previous embodiments. For instance, the light modulation layers 222A to 222F may have the low light transmittance. In some embodiments, the light modulation layers 222A to 222F are, for instance, black or gray light shielding layers, light shielding layers with reflective properties (e.g., white reflection layers), light filter layers (e.g., color filter layers), or other light shielding layers with the low light transmittance. In addition, in some embodiments, the light modulation layers 222D to 222F may have a structure of unequal thicknesses, i.e., the thicknesses of the light modulation layers 222D to 222F may be reduced when the light modulation layers 220D to 220F are approaching the upper surface U216A of the cover layer 216A.

FIG. 5A to FIG. 5F are schematic cross-sectional views of a portion of the electronic device depicted in FIG. 2 along the line I-I' according to individual embodiments of the disclosure. Electronic devices 400A to 400F depicted in FIG. 5A to FIG. 5F may respectively represent a manner of implementing one of the splicing units 12 in FIG. 1. The electronic devices 400A to 400F depicted in FIG. 5A to FIG. 5F are substantially similar to the electronic devices 300A to 300F depicted in FIG. 4A to FIG. 4F; hence, the same reference numbers in these embodiments represent the same components, and the features of the same or similar components may be cross-referenced.

Figure 5A:
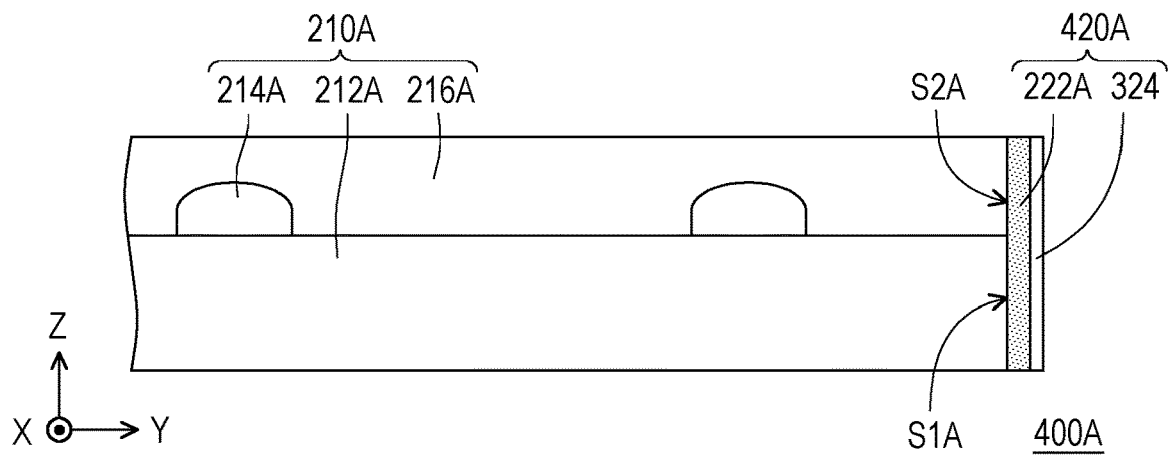
FIG. 5A to FIG. 5F are schematic cross-sectional views of a portion of the electronic device depicted in FIG. 2 along the line I-I' according to individual embodiments of the disclosure.
Figure 5B:
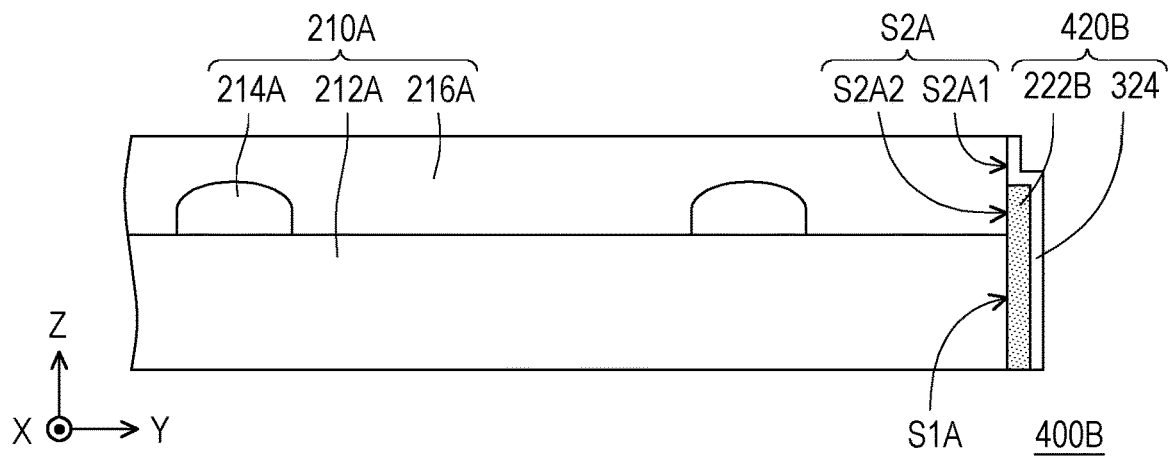
Figure 5C:
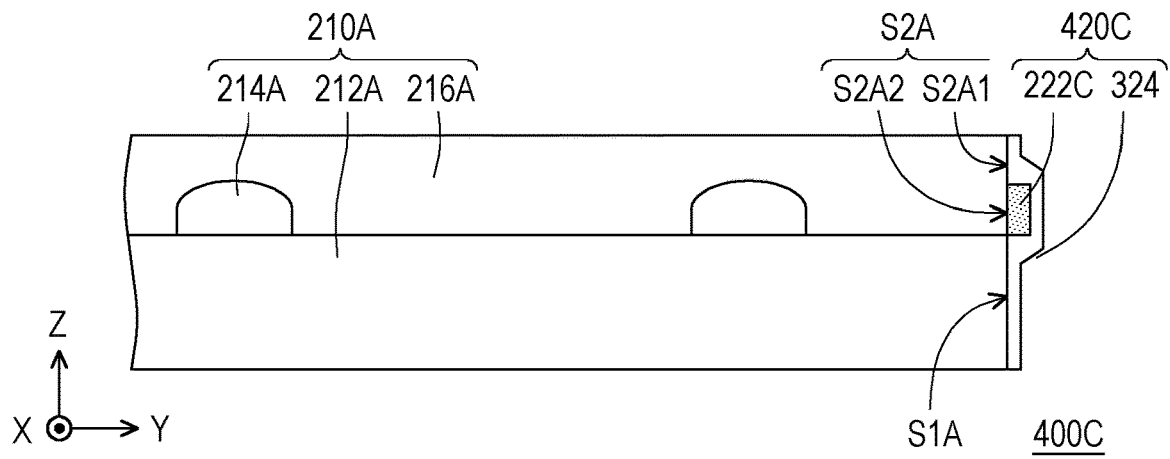
Figure 5D:
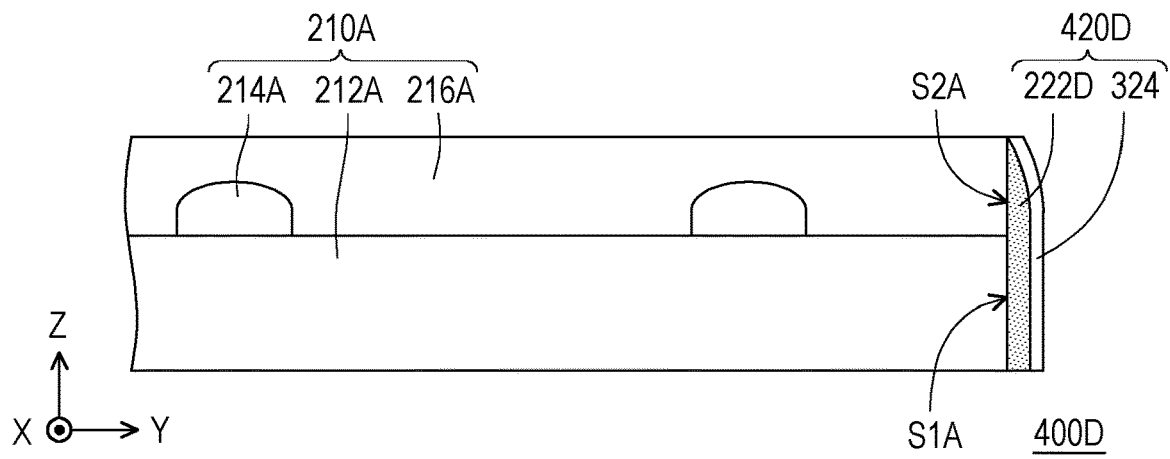
Figure 5E:
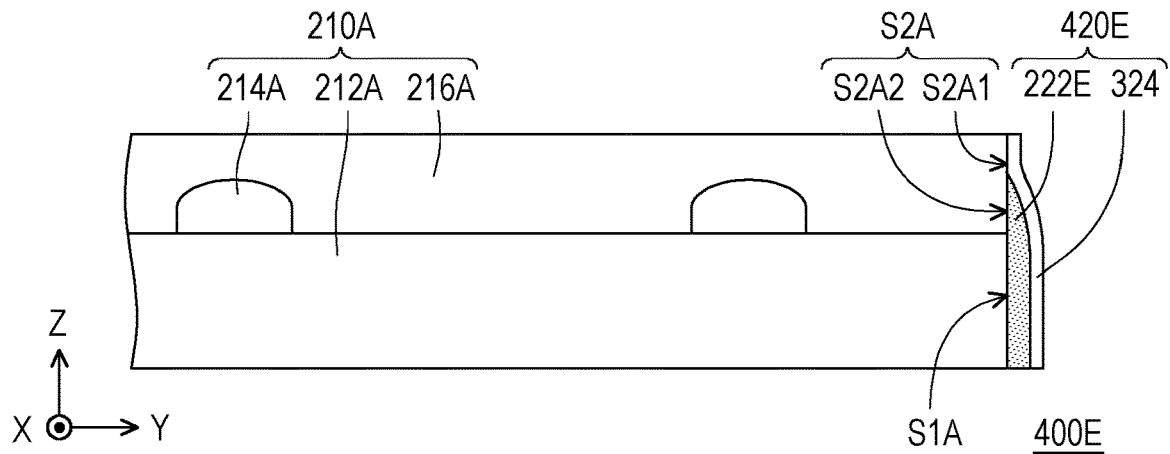
Figure 5F:
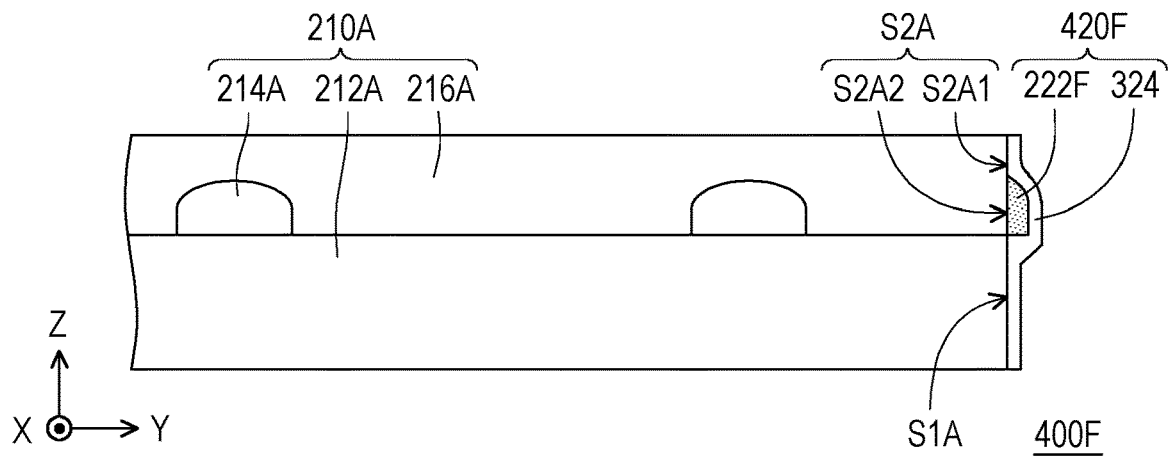

Specifically, the electronic device 400A in FIG. 5A includes the electronic unit 210A and a functional unit 420A, and the difference between the functional unit 420A and the functional unit 320A in FIG. 4A lies in that the light modulation layer 222A of the functional unit 420A is disposed between the anti-static layer 324 and the electronic unit 210A. The electronic device 400B in FIG. 5B includes the electronic unit 210A and a functional unit 420B, and the difference between the functional unit 420B and the functional unit 320B in FIG. 4B lies in that the light modulation layer 222B of the functional unit 420B is disposed between the anti-static layer 324 and the electronic unit 210A. The electronic device 400C in FIG. 5C includes the electronic unit 210C and a functional unit 420C, and the difference between the functional unit 420C and the functional unit 320C in FIG. 4C lies in that the light modulation layer 222C of the functional unit 420C is disposed between the anti-static layer 324 and the electronic unit 210C. The electronic device 400D in FIG. 5D includes the electronic unit 210D and the functional unit 420D, and the difference between the functional unit 420D and the functional unit 320D in FIG. 4D lies in that the light modulation layer 222D of the functional unit 420D is disposed between the anti-static layer 324 and the electronic unit 210D. The electronic device 400E in FIG. 5E includes the electronic unit 210E and a functional unit 420E, and the difference between the functional unit 420E and the functional unit 320E in FIG. 4E lies in that the light modulation layer 222E of the functional unit 420E is disposed between the anti-static layer 324 and the electronic unit 210E. The electronic device 400F in FIG. 5F includes the electronic unit 210A and a functional unit 420F, and the difference between the functional unit 420F and the functional unit 320F in FIG. 4F lies in that the light modulation layer 222F of the functional unit 420F is disposed between the anti-static layer 324 and the electronic unit 210F.

Figure 6A:
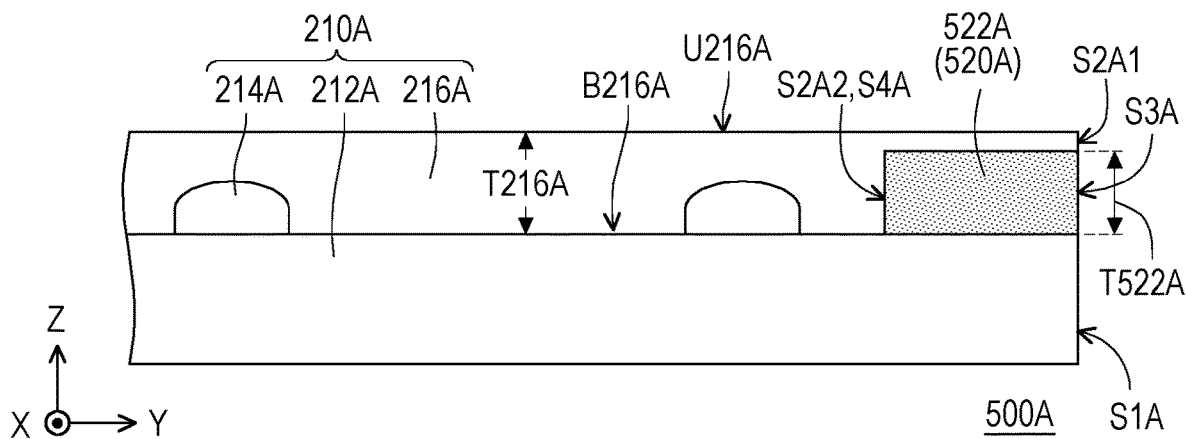
FIG. 6A to FIG. 6F are schematic cross-sectional views of a portion of the electronic device depicted in FIG. 2 along the line I-I' according to individual embodiments of the disclosure.

FIG. 6A to FIG. 6F are schematic cross-sectional views of a portion of the electronic device depicted in FIG. 2 along the line I-I' according to individual embodiments of the disclosure. Electronic devices 500A to 500F depicted in FIG. 6A to FIG. 6F may respectively represent a manner of implementing one of the splicing units 12 in FIG. 1. In FIG. 6A, the electronic device 500A includes the electronic unit 210A and a functional unit 520A. The electronic unit 210A includes the substrate 212A, the semiconductor components 214A, and the cover layer 216A, and the specific features of the electronic unit 210A may refer to the description of the embodiment as shown in FIG. 3A and will not be further explained. The cross-sectional structure depicted in FIG. 6A corresponds to the line I-I' in FIG. 2; hence, one of the first side surfaces S1A of the substrate 212A and one of the second side surfaces S2A of the cover layer 216A are shown for explanation. The functional unit 520A is disposed on the first side surface S1A and the second side surface S2A. The functional unit 520A may include a light modulation device 522A, and the light modulation device 522A is disposed between the substrate 212A and the cover layer 216A.

As shown in FIG. 6A, the second side surface S2A of the cover layer 216A has a section S2A1 that is substantially aligned to the first side surface S1A of the substrate 212A and close to the upper surface U216A and a section S2A2 that is retracted relative to the first side surface S1A and close to the lower surface B216A. An outer surface S3A of the light modulation device 522A may be aligned to at least one of the first side surface S1A and the section S2A1 of the second side surface S2A. The light modulation device 522A may be located on the section S2A2 of the second side surface S2A2, and an inner surface S4A of the light modulation device 522A and the section S2A2 of the second side surface S2A2 may be overlapped. Thereby, the section S2A1 of the second side surface S2A, the outer surface S3A, and the first side surface S1A may define the sides of the electronic device 500A. In addition, a thickness T522A of the light modulation device 522A may be less than the thickness T216A of a portion of the cover layer 216A covering the semiconductor components 214A, wherein the thickness T216A is, for instance, a distance between the upper surface U216A and the lower surface B216A, which should however not be construed as a limitation in the disclosure. As such, the section S2A1 of the second side surface S2A of the cover layer 216A is not covered by the functional unit 520A.

In some embodiments, the material and the characteristics of the light modulation device 522A may be derived from those of the light modulation layers 222A to 222F provided in the previous embodiments. In other words, the light modulation device 522A may have the low light transmittance. At the section S2A2 of the second side surface S2A, the light emitted by the semiconductor components 214A is blocked by the light modulation device 522A of the functional unit 520A and thus is refracted or scattered and then transmitted out. Hence, the edge light leakage issue of the electronic device 500A may be alleviated, and the edge of the electronic device 500A may have a certain brightness, which is conducive to the improvement of brightness uniformity in the application of splicing products. In this embodiment, the cross-sectional shape of the light modulation device 522A is rectangular; hence, the section S2A2 of the second side surface S2A and the outer surface S3A of the light modulation device 522A may be substantially parallel, which should however not be construed as a limitation in the disclosure.

Figure 6B:
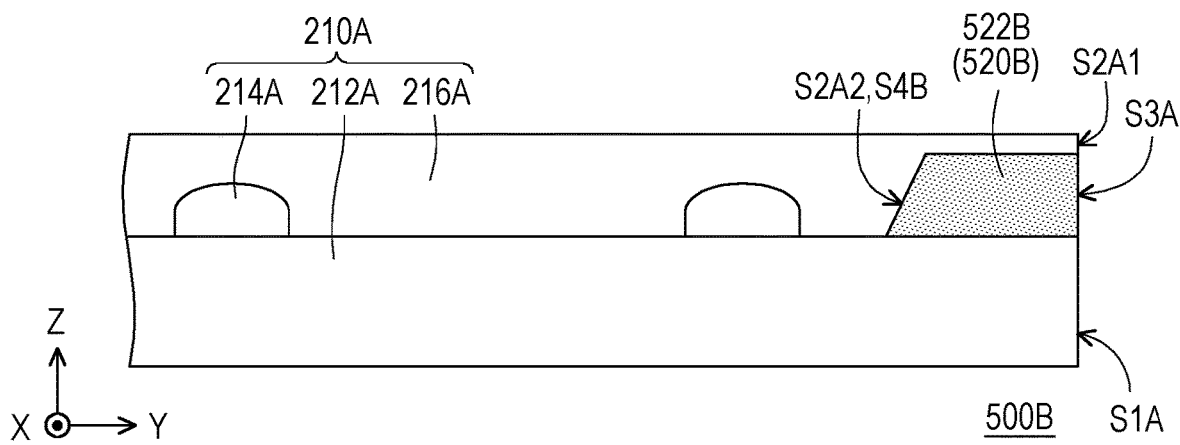
Figure 6C:
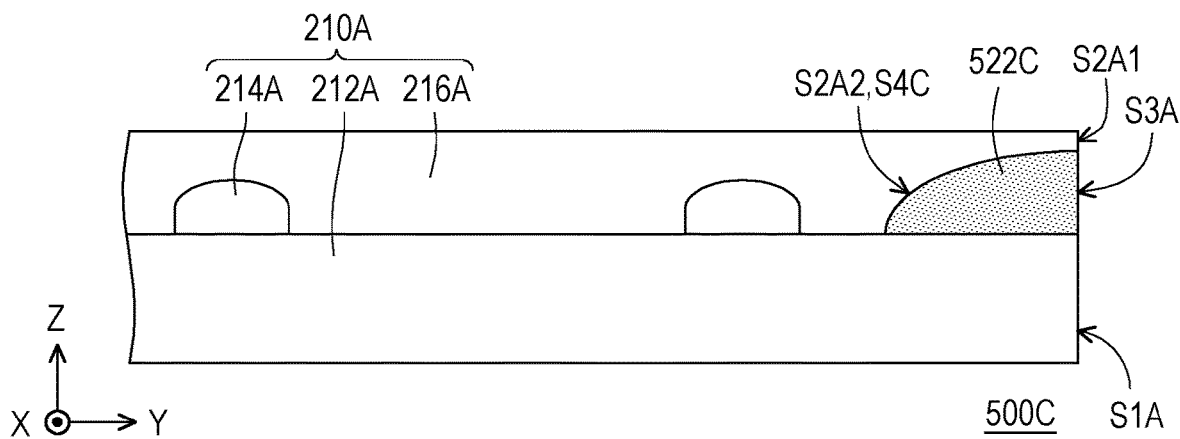

The electronic device 500B depicted in FIG. 6B and the electronic device 500C depicted in FIG. 6C are substantially similar to the electronic device 600A depicted in FIG. 6A; hence, the same reference numbers in these embodiments represent the same components, and the features of the same or similar components may be cross-referenced. In the electronic device 500B in FIG. 6B, the section S2A2 of the second side surface S2A of the cover layer 216A is inclined relative to the section S2A1 of the second side surface S2A, and a light modulation device 522B of the functional unit 520B has a trapezoidal shape. An inner side surface S4B of the light modulation device 522B overlaps the section S2A2 of the second side surface S2A and is inclined relative to the outer surface S3A. In the electronic device 500C in FIG. 6C, the section S2A2 of the second side surface S2A of the cover layer 216A has an arc shape. An inner side surface S4C of the light modulation device 522C overlaps the section S2A2 of the second side surface S2A and is arc-shaped. In terms of the cross-sectional structure, the light modulation device 522B and the light modulation device 522C have, for instance, the width that is reduced together with the increase in the distance away from the substrate 212A.

Figure 6D:
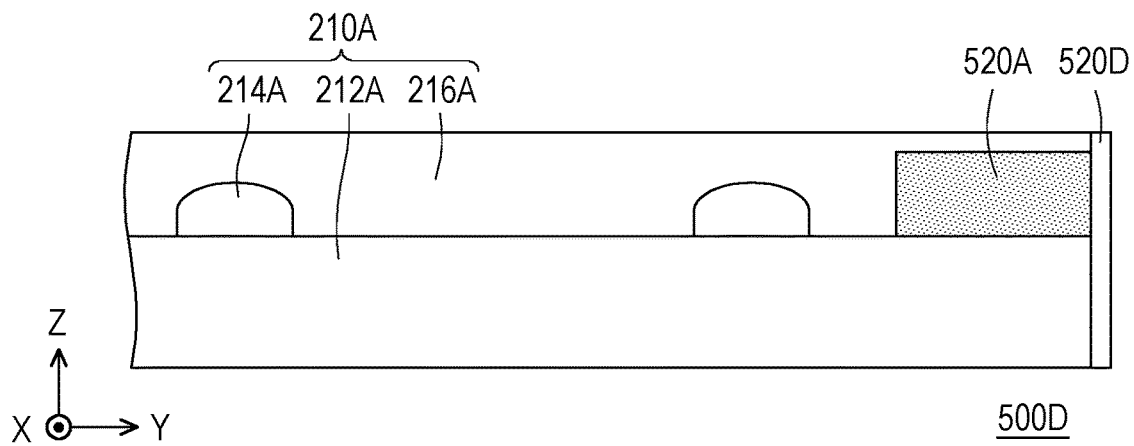
Figure 6E:
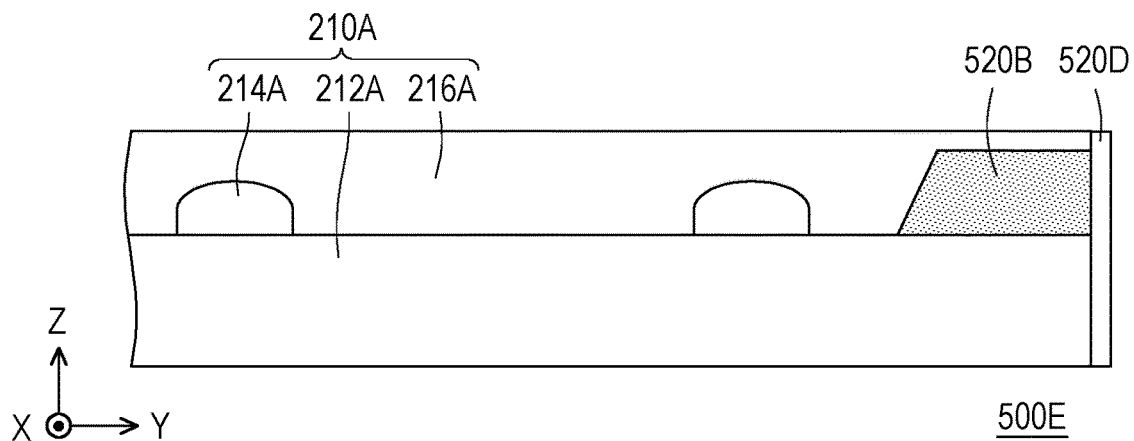
Figure 6F:
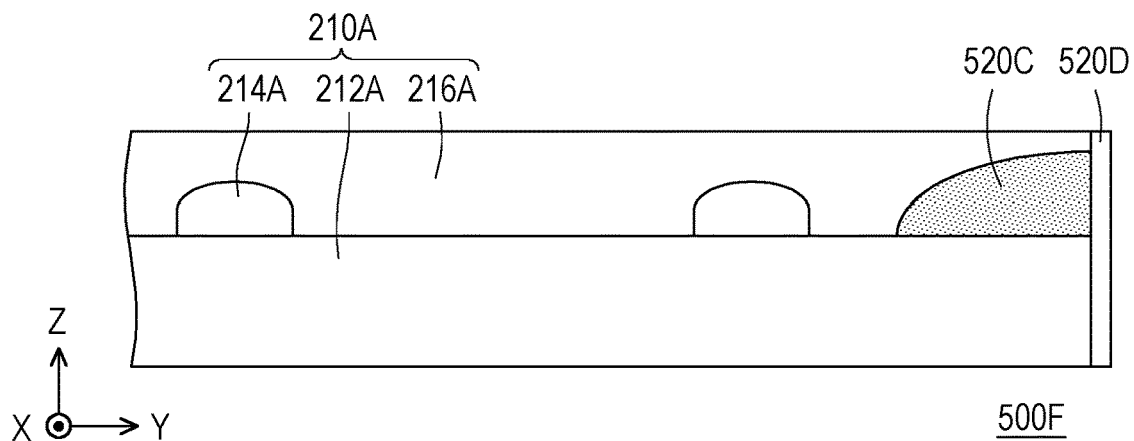

The electronic devices 500D to 500F depicted in FIG. 6D to FIG. 6F are substantially similar to the electronic devices 500A to 500C; hence, the same reference numbers in these embodiments represent the same components, and the features of the same or similar components may be cross-referenced. Specifically, in addition to electronic device 500A, the electronic device 500D also includes a functional unit 520D; in addition to the electronic device 500B, the electronic device 500E also includes the functional unit 520D; in addition to electronic device 500C, the electronic device 500F also includes the functional unit 520D. Here, for instance, the functional unit 520D may be implemented by any of the functional units 220A to 220F and 320A to 320F provided in the previous embodiments.

Figure 7:
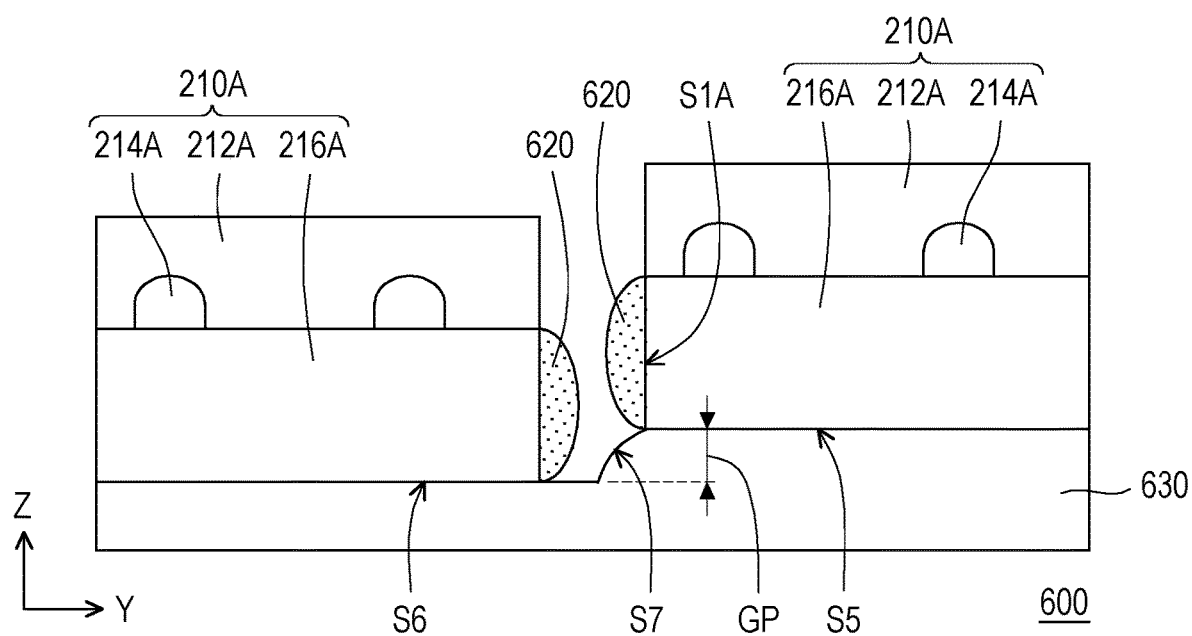
FIG. 7 is a schematic view of a portion of an electronic device according to an embodiment of the disclosure.

FIG. 7 is a schematic view of a portion of an electronic device according to an embodiment of the disclosure. The cross-sectional structure shown in FIG. 7 may correspond to the exemplary cross-section across two adjacent splicing units 12 in FIG. 1. In FIG. 7, the electronic device 600 includes a plurality of electronic units 210A, a plurality of functional units 620, and a back plate 630. The components of the electronic units 210A, the arrangement relationship between the components, the materials, and the characteristics may be derived from the description provided in the previous embodiments. In FIG. 7 and the previous drawings, the same reference numbers represent the same components and thus will not be further explained hereinafter. The electronic units 210A are disposed on the back plate 630; that is, the back plate 630 is disposed below the electronic units 210A. Each functional unit 620 is disposed on the corresponding electronic unit 210A. Each functional unit 620 may be disposed on the first side surface S1A of the substrate 212A of the corresponding electronic unit 210A, which should however not be construed as a limitation in the disclosure. The functional units 620 are located between two adjacent electronic units 210A. The X axis and the Y axis in FIG. 7 serve to illustrate the arrangement relationship between the components. In some embodiments, the X axis and the Y axis may be perpendicular or intersecting axes.

In this embodiment, the back plate 620 has, for instance, a first surface S5, a second surface S6, and a side surface S7 between the first surface S5 and the second surface S6. The first surface S5 and the second surface S6 are located at different heights, and the side surface S7 is connected between the first surface S5 and the second surface S6 to form a sectional difference GP. The side surface S7 may be an inclined surface or a curved surface. For instance, the distance in the Z-axis direction between an extension line of the first surface S5 along the Y axis and an extension line of the second surface S6 along the Y axis may be the sectional difference GP. In some embodiments, the Z axis may be parallel to a thickness direction of the back plate 630. The two electronic units 210A in FIG. 7 are respectively disposed on the first surface S5 and the second surface S6. For the electronic unit 210A located on the first surface S5, the side surface S7 and at least one portion of the functional device 620 on the electronic unit 210A may be overlapped in the Z-axis direction of the back plate 630. For the electronic unit 210A located on the second surface S6, the side surface S7 and at least one portion of the functional device 620 on the electronic unit 210A may be overlapped in the Y-axis direction of the back plate 630. The two electronic units 210A in FIG. 7 are at different heights, and the adjacent functional units 620 can be closer to reduce the distance between them. As such, when the electronic units are applied to a spliced product, visibility of splicing gaps may be reduced, and the overall visual effect of the product may be improved. For instance, the images displayed by two adjacent electronic units 210A may achieve better continuity due to the reduction of the distance.

The functional unit 620 may include a light modulation layer which may have light reflective properties to certain extent, so as to modulate the brightness between the adjacent electronic units 210A. In some embodiments, a material of the light modulation layer of the functional unit 620 may be a light-colored (e.g., white) ink or a similar material. In some embodiments, the material of the light modulation layer of the functional unit 620 may refer to the materials of the light modulation layers provided in the previous embodiments. In other words, the functional device 620 disposed on each electronic unit 210A may be replaced by any functional unit provided in the previous embodiment and is not limited to the component shown in FIG. 7.

Figure 8:
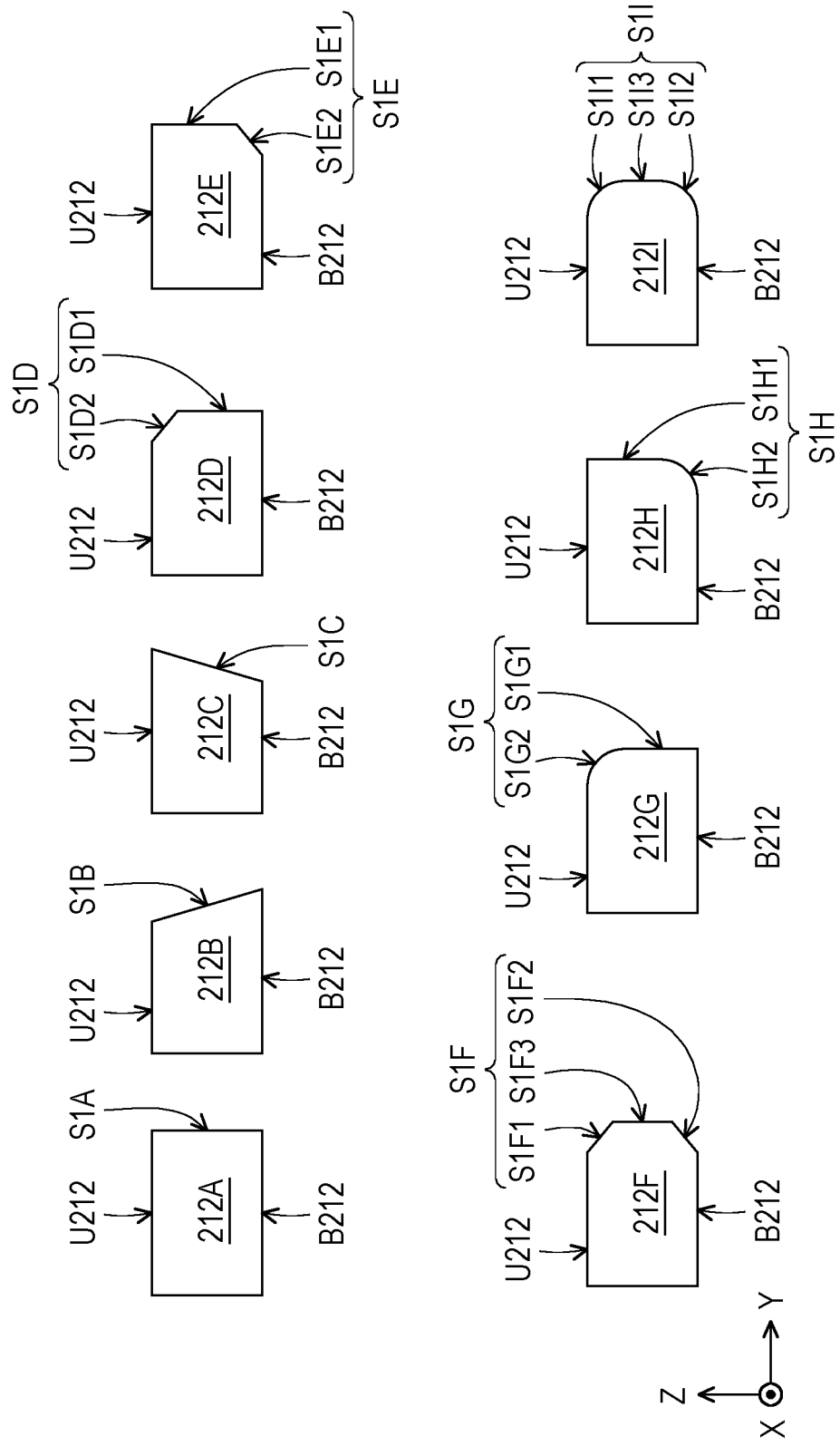
FIG. 8 is a schematic view of a cross-sectional structure of a substrate of an electronic unit according to several embodiments of the disclosure.

FIG. 8 is a schematic view of a cross-sectional structure of a substrate of an electronic unit according to several embodiments of the disclosure. Substrates 212A to 212I in FIG. 8 may be applied to the electronic units 210A provided in any of the previous embodiments. The substrates 212A to 212I each have an upper surface U212 and a lower surface B212 opposite to each other in the Z-axis direction; when the substrates 212A to 212I are applied in the previous embodiments, the semiconductor components 214A and the cover layer 216A may be disposed on the upper surface U212. In addition, the substrates 212A to 212I have first side surfaces S1A to S1I which are of different types and are each connected between the upper surface U212 and the lower surface B212.

The first side surface S1A of the substrate 212A extends, for instance, along the Z axis. The first side surface S1B of the substrate 212B is inclined relative to the Z axis, so that the upper surface U212 is retracted relative to the lower surface B212. The first side surface S1C of the substrate 212C is inclined relative to the Z axis, so that the upper surface U212 protrudes relative to the lower surface B212. The first side surface S1D of the substrate 212D includes a section S1D1 close to the upper surface U212 and a section S1D2 close to the lower surface B212, wherein the section S1D1 is inclined relative to the Z axis, and the section S1D2 is substantially parallel to the Z axis. Thereby, the upper surface U212 of the substrate 212D is retracted relative to the lower surface B212, and a chamfer is formed between the section S1D1 and the upper surface U212 at the substrate 212D. The first side surface S1E of the substrate 212E includes a section S1E1 close to the upper surface U212 and a section S1E2 close to the lower surface B212, wherein the section S1E1 is substantially parallel to the Z axis, and the section S1E2 is inclined relative to the Z axis. In addition, the lower surface B212 of the substrate 212E is retracted relative to the upper surface U212. Thereby, a chamfer is formed between the section S1E1 and the lower surface B212 at the substrate 212E. The first side surface S1F of the substrate 212F includes a section S1F1 close to the upper surface U212, a section S1F2 close to the lower surface B212, and a section S1F3 between section S1F1 and section S1F2. Both sections S1F1 and S1F2 are inclined relative to the Z axis, while the section S1F3 is substantially parallel to the Z axis. In addition, the upper surface U212 and the lower surface B212 of the substrate 212F are farther away from the section S1F3 in the Y-axis direction than the sections S1F1 and S1F2. Thereby, a chamfer is formed between the section S1F3 and the upper surface U212 at the substrate 212F, and a chamfer is formed between the section S1F3 and the lower surface B212 at the substrate 212F. The first side surface S1G of the substrate 212G includes a section S1G1 close to the upper surface U212 and a section S1G2 close to the lower surface B212, wherein the section S1G1 is arc-shaped, and the section S1G2 is substantially parallel to the Z axis. As such, the upper surface U212 of the substrate 212G is retracted relative to the lower surface B212, and an R angle is formed between the section S1G2 and the upper surface U212 at the substrate 212G. The first side surface S1H of the substrate 212H includes a section S1H1 close to the upper surface U212 and a section S1H2 close to the lower surface B212, wherein the section S1H 1 is substantially parallel to the Z axis, and the section S1H2 is arc-shaped. As such, the lower surface B212 of the substrate 212H is retracted relative to the upper surface U212, and an R angle is formed between the section S1H1 and the lower surface B212 at the substrate 212H. The first side surface S1I of the substrate 212I includes a section Sin close to the upper surface U212, a section S1I2 close to the lower surface B212, and a section S1I3 between the section Sill and the section S1I2. Both sections Sill and S1I2 are arc-shaped, while the section S1I3 is substantially parallel to the Z axis. In addition, the upper surface U212 and the lower surface B212 of the substrate 212I are farther away from the section S1I3 in the Y-axis direction than the sections S1I1 and S1I2. Thereby, an R angle is formed between the section S1I3 and the upper surface U212 at the substrate 212I, and an R angle is formed between the section S1I3 and the lower surface B212 at the substrate 212I.

Figure 9:
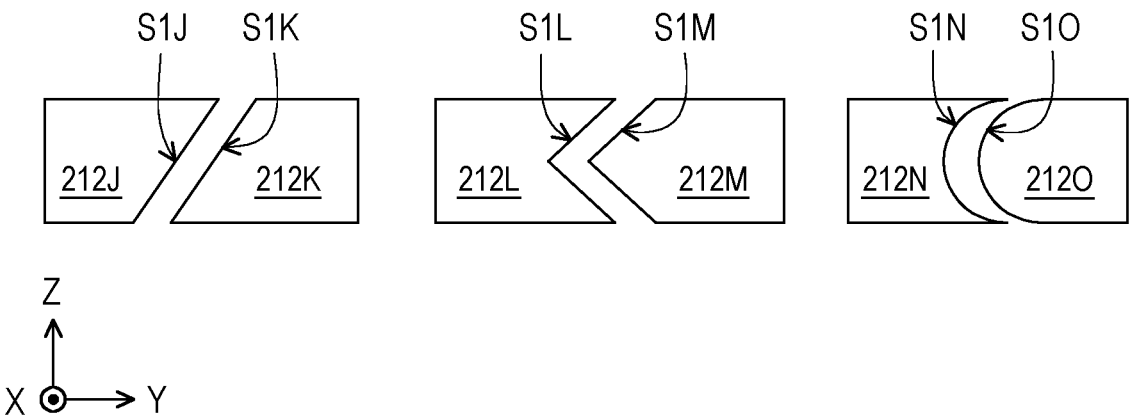
FIG. 9 is a schematic view of a portion of substrates of two adjacent electronic units according to several embodiments of the disclosure.

FIG. 9 is a schematic view of a portion of substrates of two adjacent electronic units according to several embodiments of the disclosure. A substrate 212J and a substrate 212K are respectively the substrates of two adjacent electronic units, and a first side surface S1J of the substrate 212J and a first side surface S1K of the substrate 212K correspond to each other. For instance, the first side surface S1J and the first side surface S1K are inclined relative to the Z axis and are substantially parallel to each other. Both a first side surface S1L of a substrate 212L and a first side surface S1M of a substrate 212M have a "<"-like shape and correspond to each other. Both a first side surface S1N of a substrate 212N and a first side surface S1O of a substrate 212O are substantially shaped as an arc and correspond to each other. The corresponding shapes of the first side surfaces of the adjacent substrates in FIG. 9 are merely exemplary for illustrative purposes. In some embodiments, the first side surfaces of the substrates may have various shapes. For instance, a cross-sectional structure of the first side surfaces of the substrate may have a right angle, a C-shaped chamfer, an R angle, an arc-shaped profile, a regular shape, or an irregular shape.

Figure 10:
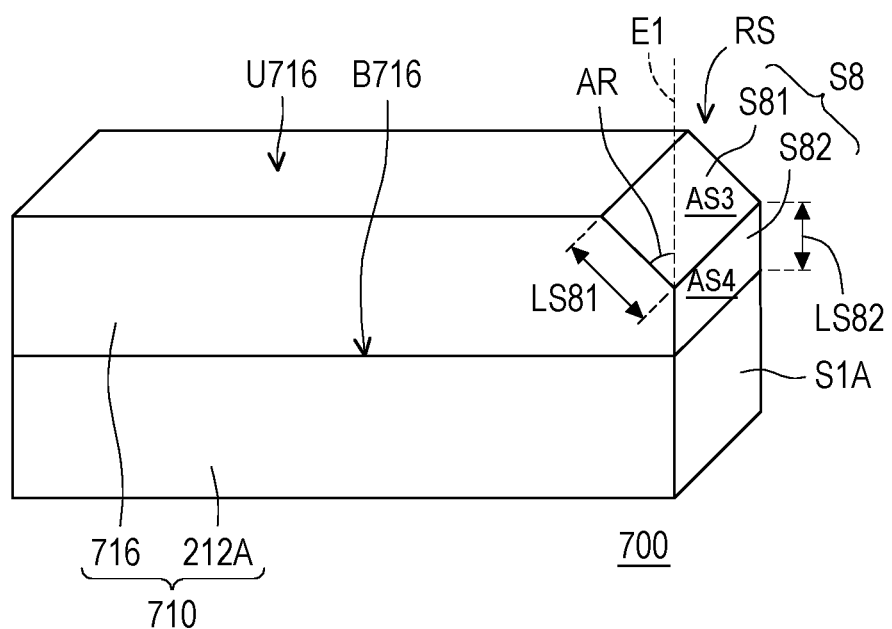
FIG. 10 is a schematic three-dimensional view of an electronic device according to an embodiment of the disclosure.

FIG. 10 is a schematic three-dimensional view of an electronic device according to an embodiment of the disclosure. An electronic device 700 includes an electronic unit 710, wherein the electronic unit 710 includes the substrate 212A, a plurality of semiconductor components (not shown), and a cover layer 716. Since FIG. 10 shows the appearance of the electronic device 700, and the semiconductor components are disposed between the substrate 212A and the cover layer 716, the semiconductor components are not shown in FIG. 10. However, how the semiconductor components are disposed between the substrate 212A and the cover layer 716 may be derived from the description provided in the previous embodiments. In this embodiment, the substrate 212A has the first side surface S1A, the cover layer 716 has a second side surface S8, and the second side surface S8 has a chamfer structure RS.

Specifically, the first side surface S1A has an extension direction E1, and the chamfer structure RS has a third side surface S81 which is not parallel to the extension direction E1. In addition, the chamfer structure RS further has a fourth side surface S82 parallel to the extension direction E1, and an area AS81 of the third side surface S81 is greater than 10% of the sum of the area AS81 of the third side surface S81 and an area AS82 of the fourth side surface S82. In other words, the second side surface S8 may be understood as the surface connected between an upper surface U716 and a lower surface B716 of the cover layer 716, and the second side surface S8 may be composed of the third side surface S81 and the fourth side surface S82. In other embodiments, the area AS81 of the third side surface S81 is, for instance, 100% of the sum of the area AS81 of the third side surface S81 and the area AS82 of the fourth side surface S82. That is to say, the second side surface S8 may not include the fourth side surface S82 but is constituted by the third side surface S81 inclined relative to the extension direction E1. In addition, an angle AR between the extension direction E1 and the third side surface S81 is defined, and the angle AR is 1 degree to 60 degrees, which should however not be construed as a limitation in the disclosure. In some embodiments, the area of the so-called side surface, for instance, is determined by selecting 2, 3, or a plurality of side lengths of the substrate 212A as the base of the area in a top view and measuring the average length of the side surface in the cross section (e.g., a length LS81 of the third side surface S81 or a length LS82 of the fourth side surface S82 in FIG. 10) as the height of the area. After that, the base and the height of the area are multiplied to obtain the area of the corresponding side surface. In addition, in this disclosure, being parallel means that two linear directions/structures are intersected by 0 degree to 10 degrees or intersected by 0 degree to 5 degrees.

Various aspects of the chamfer of the cover layer are described below as exemplary explanations, whereas the chamfer of the cover layer is not limited to those provided in the exemplary explanations. FIG. 11A to FIG. 11J are schematic views of a cross-sectional structure of a substrate of an electronic device according to several embodiments of the disclosure. Electronic devices 800A to 800J in FIG. 11A to FIG. 11J respectively include electronic units 810B to 810K. The electronic units 810B to 810K respectively include the substrate 212A and the semiconductor components 214A. The description of the substrate 212A and the semiconductor components 214A may be derived from the description provided in the previous embodiments and thus will not be further provided. In addition, the electronic units 810A to 810J further include cover layers 816A to 816J disposed on the semiconductor components 214A, respectively, wherein the cover layers 816A to 816J have different structures.

Figure 11A:
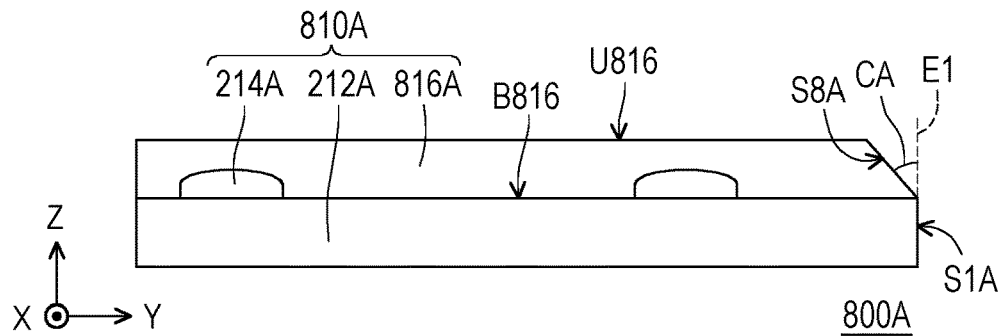
FIG. 11A to FIG. 11J are schematic views of a cross-sectional structure of a substrate of an electronic device according to several embodiments of the disclosure.

In the electronic unit 810A of the electronic device 800A, the cover layer 816A has an upper surface U816, a lower surface B816, and a second side surface S8A connected between the upper surface U816 and the lower surface B816. In a top view (not shown), the cover layer 816A may have a polygonal shape and thus may have a plurality of the second side surfaces S8A, and one of the second side surfaces S8A is illustrated in the cross-sectional structure shown in FIG. 11A. An end of the second side surface S8A adjacent to the lower surface B816 may be in contact with the first side surface S1A of the substrate 212A, which should however not be construed as a limitation in the disclosure. The second side surface S8A may have a chamfer structure. For instance, the second side surface S8A may be inclined relative to the first side surface S1A. In addition, as shown in FIG. 11A, the farther the second side surface S8A away from the lower surface B816, the more retracted the second side surface S8A relative to the first side surface S1A, and the entire second side surface S8A overlaps the substrate 212A (or is located within the area of the substrate 212A) in the Z-axis direction. The inclined second side surface S8A and the extension direction E1 of the first side surface S1A has a cut angle CA, and the cut angle CA is, for instance, 1 degree to 60 degrees. There is no cover layer 816A at the region of the cut angle CA (e.g., the region surrounded by the side surface S8A and the extension direction E1), which constitutes the so-called negative chamfer in the disclosure.

Figure 11B:
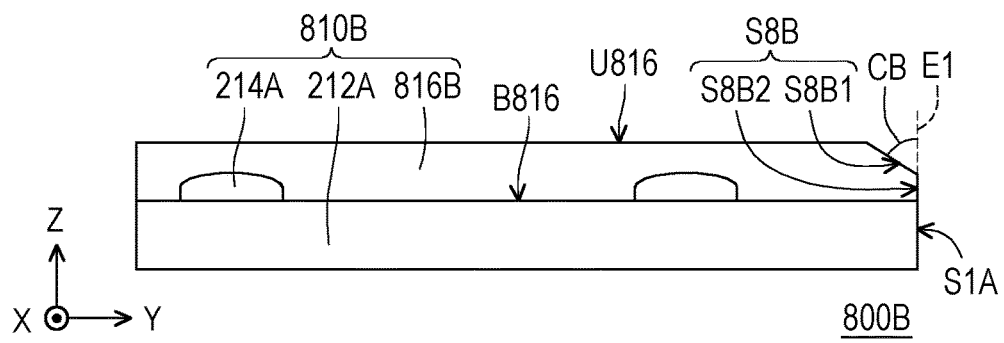
Figure 11C:
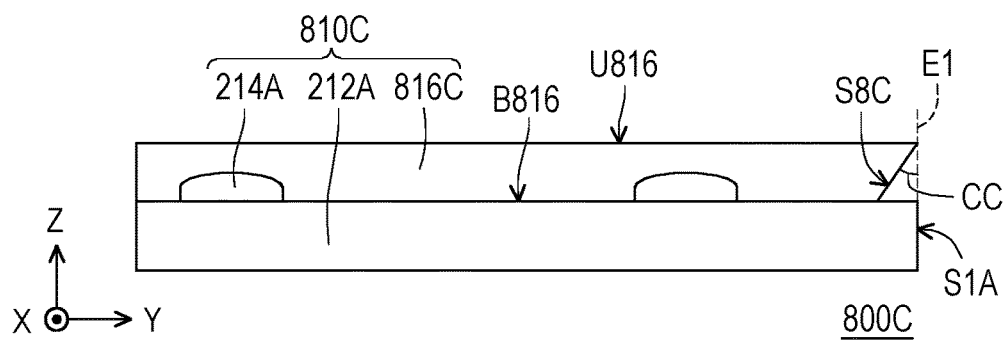

In the electronic device 800B in FIG. 11B, the cover layer 810B of the electronic unit 810B has a chamfer structure on the second side surface S8B. The second side surface S8B may be divided into, for instance, a side surface S8B1 and a side surface S8B2, wherein the side surface S8B1 is closer to the upper surface U816, and the side surface S8B2 is closer to the lower surface B816. The first side surface S1A has the extension direction E1, and the chamfer structure has the side surface S8B1 that is not parallel to the extension direction E1, wherein a cut angle CB between the extension direction E1 and the side surface S8B1 is defined, and the cut angle CB is, for instance, 1 degree to 60 degrees. In this embodiment, the cover layer 816B may have a negative chamfer structure on the second side surface S8B. For instance, the farther the side surface S8B2 away from the lower surface B816, the more retracted the side surface S8B2 relative to the first side surface S1A, and there is no cover layer 816B at the region of the cut angle CB (e.g., the region surrounded by the side surface S8B1 and the extension direction E1). In addition, the side surface S8B2 of the second side surface S8B may be substantially parallel to the extension direction E1 of the first side surface S1A, which should however not be construed as a limitation in the disclosure.

In the electronic unit 810C of the electronic device 800C, the second side surface S8C of the cover layer 816C may have a chamfer structure. For instance, the second side surface S8C may be inclined relative to the extension direction E1 of the first side surface S1A. In addition, the farther the second side surface S8C away from the upper surface U816, the more retracted the second side surface S8C relative to the first side surface S1A, and the entire second side surface S8C overlaps the substrate 212A (or is located within the area of the substrate 212A) in the Z-axis direction. The inclined second side surface S8C and the extension direction E1 of the first side surface S1A has a cut angle CC, and the cut angle CC is, for instance, 1 degree to 60 degrees. There is no cover layer 816C at the region of the cut angle CC (e.g., the region surrounded by the second side surface S8C and the extension direction E1), which constitutes the so-called negative chamfer in the disclosure.

Figure 11D:
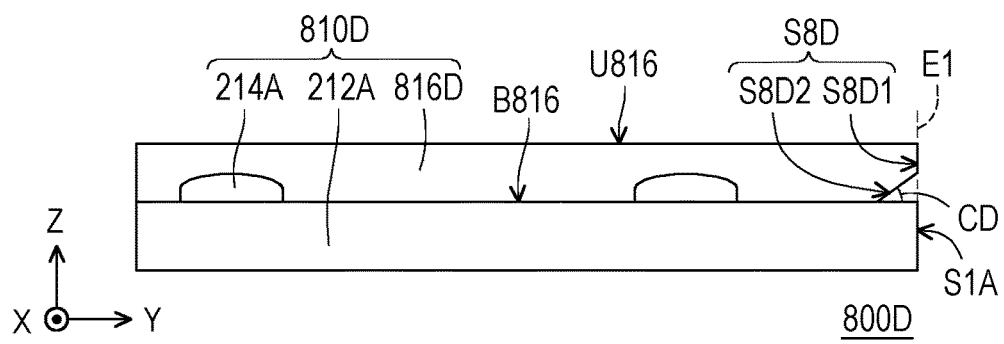

In the electronic device 800D in FIG. 11D, the cover layer 810D has a chamfer structure on the second side surface S8D. The second side surface S8D may be divided into, for instance, a side surface S8D1 and a side surface S8D2, wherein the side surface S8D1 is closer to the upper surface U816, and the side surface S8D2 is closer to the lower surface B816. The first side surface S1A has the extension direction E1, and the chamfer structure has the side surface S8D2 that is not parallel to the extension direction E1, wherein a cut angle CD between the extension direction E1 and the side surface S8D2 is defined, and the cut angle CD is, for instance, 1 degree to 60 degrees. In this embodiment, the entire second side surface S8D of the cover layer 810B overlaps the substrate 212A (or is located within the area of the substrate 212A) in the Z-axis direction without exceeding the first side surface S1A, which should however not be construed as a limitation in the disclosure. In addition, there is no cover layer 816D at the region of the cut angle CD (e.g., the region surrounded by the side surface S8D2 and the extension direction E1), which constitutes the so-called negative chamfer in the disclosure.

Figure 11E:
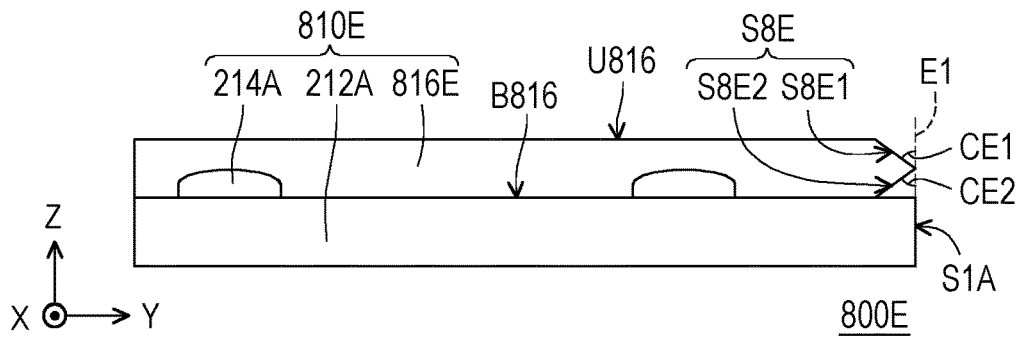

In the electronic device 800E in FIG. 11E, the cover layer 810E has a chamfer structure on the second side surface S8E. The second side surface S8E may be divided into, for instance, a side surface S8E1 and a side surface S8E2, wherein the side surface S8E1 is closer to the upper surface U816 and the side surface S8E2 is closer to the lower surface B816. The first side surface S1A has the extension direction E1, and neither the side surface S8E1 nor the side surface S8E2 is parallel to the extension direction E1, so that two chamfers are formed at the edge of the cover layer 816E. The farther the side surface S8E1 away from the lower surface B816, the more retracted side surface S8E1 relative to the first side surface S1A; the closer the side surface S8E1 to the lower surface B816, the more retracted side surface S8E1 relative to the first side surface S1A. The side surface S8E1 and the side surface S8E2 may constitute a sharp angle. In addition, the side surface S8E1 and the side surface S8E2 may both overlap the substrate 212A in the Z-axis direction without exceeding the substrate 212A, which should however not be construed as a limitation in the disclosure. An angle CE1 between the side surface S8E1 and the extension direction E1 of the substrate 212A is defined, and an angle CE2 between the side surface S8E2 and the extension direction E1 of the substrate 212A is defined. Each of the angle CE1 and the angle CE2 ranges from 1 degree to 60 degrees, which should however not be construed as a limitation in the disclosure. The angle CE1 and the angle CE2 may be the same or different from each other.

Figure 11F:
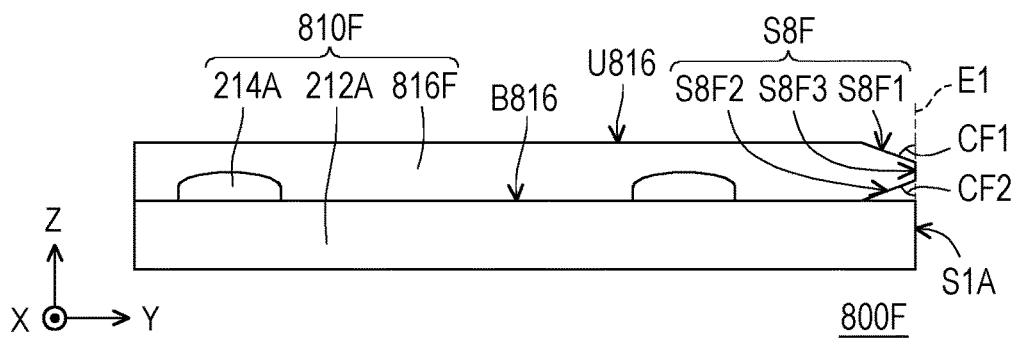

In FIG. 11F, the second side surface S8F of the cover layer 816F includes a side surface S8F1 close to the upper surface U816, a side surface S8F2 close to the lower surface B816, and a side surface S8F3 connected between the side surface S8F1 and the side surface S8F2. Both the side surface S8F1 and the side surface S8F2 are inclined relative to the extension direction E1 of the first side surface S1A of the substrate 212A, while the side surface S8F3 is substantially parallel to the extension direction E1. An angle CF1 between the side surface S8F1 and the extension direction E1 of the substrate 212A is defined, and an angle CF2 between the side surface S8F2 and the extension direction E1 of the substrate 212A is defined. Each of the angle CF1 and the angle CF2 ranges from 1 degree to 60 degrees, which should however not be construed as a limitation in the disclosure. The angle CF1 and the angle CF2 may be the same or different from each other. There is no cover layer 816F at the region of the angle CF1 between the extension direction E1 and the side surface S8F1, and there is also no cover layer 816F at the region of the angle CF2 between the extension direction E1 and the side surface S8F2.

Figure 11G:
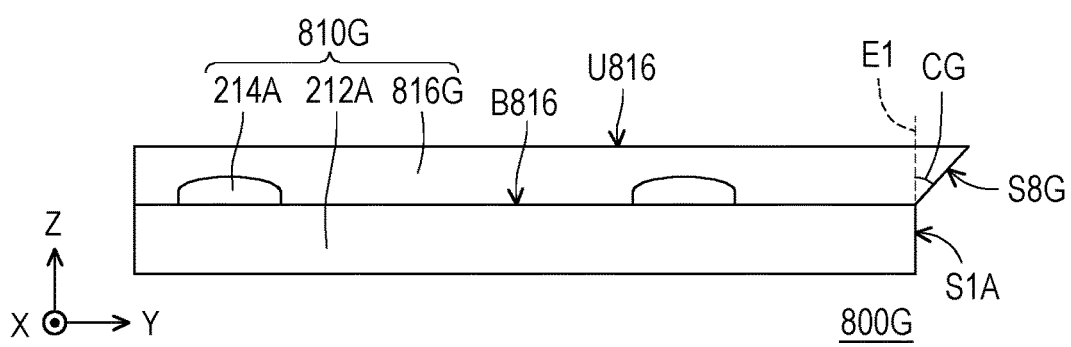

In the electronic unit 810G in the electronic device 800G, the second side surface S8G of the cover layer 816G may have a chamfer structure. For instance, the second side surface S8G may be inclined relative to the extension direction E1 of the first side surface S1A. In addition, as shown in FIG. 11G, the farther the second side surface S8G away from the lower surface B816, the more protrusive the second side surface S8G relative to the first side surface S1A from the extension direction E1 of the first side surface S1A. A cut angle CG between the inclined second side surface S8G and the extension direction E1 of the first side surface S1A is defined, and the cut angle CG is, for instance, 1 degree to 60 degrees. In this embodiment, the second side surface S8G at least partially extends beyond the substrate 212A (or is located within the area of the substrate 212A) in the Y-axis direction, and there is a cover layer 816G at the region of the cut angle CG (e.g., the region surrounded by the second side surface S8G and the extension direction E1), which constitutes the so-called positive chamfer in this disclosure.

Figure 11H:
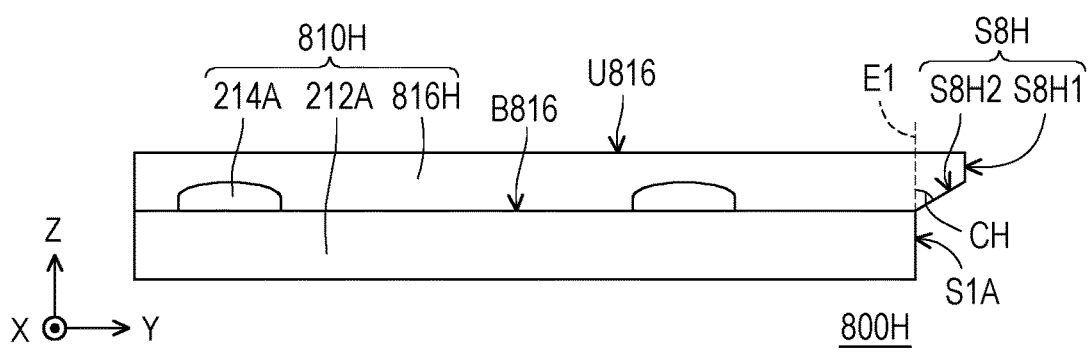

In FIG. 11H, the second side surface S8H of the cover layer 816H is connected between the upper surface U816 and the lower surface B816 and includes the side surface S8H1 close to the upper surface U816 and the side surface S8H2 close to the lower surface B816. The side surface S8H1 is parallel to the extension direction E1 of the first side surface S1A of the substrate 212A, and the side surface S8H2 is inclined relative to the extension direction E1. An angle CH between the extension direction E1 and the side surface S8H2 may be 1 degree to 60 degrees. In addition, the entire second side surface S8H is, from the extension direction E1 of the first side surface S1A, protruded from the substrate 212A in the Y-axis direction. Hence, the cover layer 816H exceeds the substrate 212A, and there is a cover layer 816H in the angle CH between the extension direction E1 and the side surface S8H2, so as to constitute the positive chamfer structure at the second side surface S8H.

Figure 11I:
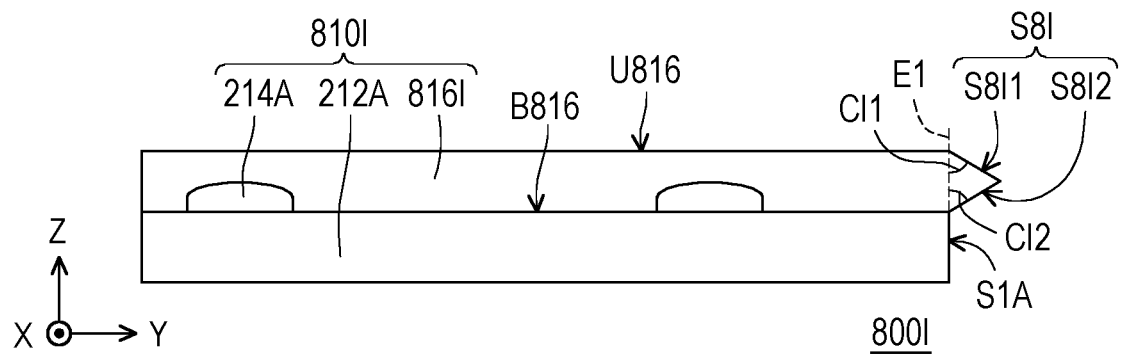

In FIG. 11I, the second side surface S8I of the cover layer 816I is connected between the upper surface U816 and the lower surface B816 and includes the side surface S8I1 close to the upper surface U816 and the side surface S8I2 close to the lower surface B816. Both the side surface S8I1 and the side surface S8I2 are inclined relative to the extension direction E1 of the first side surface S1A of the substrate 212A. The second side surface S8I of the cover layer 816I has a sharp angle shape. The side surface S8I1 and the side surface S8I2 may exceed the substrate 212A in the Y-axis direction, which should however not be construed as a limitation in the disclosure. An angle CI1 between the side surface S8I1 and the extension direction E1 of the substrate 212A is defined, and an angle CI2 between the side surface S8I2 and the extension direction E1 of the substrate 212A is defined. Each of the angle CI1 and the angle CI2 ranges from 1 degree to 60 degrees, which should however not be construed as a limitation in the disclosure. The angle CI1 and the angle CI2 may be the same or different from each other. There is a cover layer 816I at the region of the angle CI1 between the extension direction E1 and the side surface S8I1 and at the region of the angle CI2 between the extension direction E1 and the side surface S8I2, so as to constitute two positive chamfer structures at the second side surface S8I.

Figure 11J:
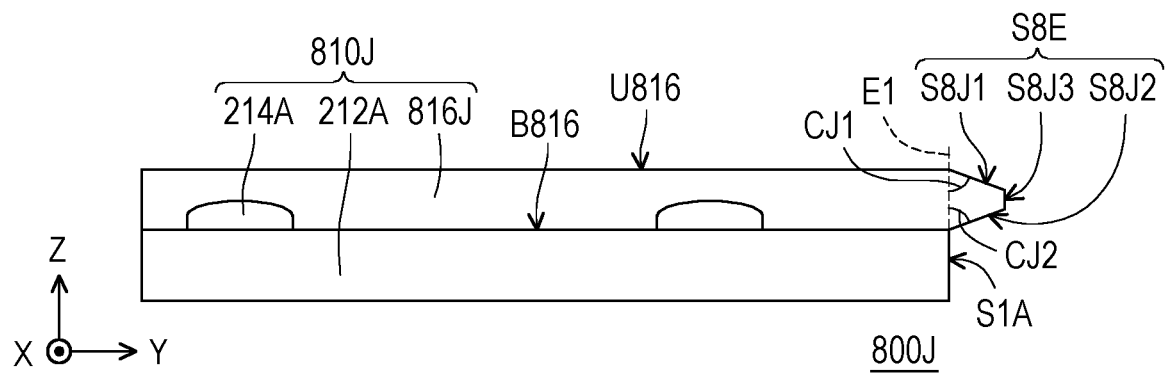

In FIG. 11J, the second side surface S8J of the cover layer 816J includes a side surface S8J1 close to the upper surface U816, a side surface S8J2 close to the lower surface B816, and a side surface S8J3 connected between the side surface S8J1 and the side surface S8J2. Both the side surface S8J1 and the side surface S8J2 are inclined relative to extension direction E1 of the first side surface S1A of the substrate 212A, and the side surface S8J3 is substantially parallel to extension direction E1. The side surface S8J1, the side surface S8J2, and the side surface S8J3 may exceed the substrate 212A in the Y-axis direction, which should however not be construed as a limitation in the disclosure. An angle CJ1 between the side surface S8J1 and the extension direction E1 of the substrate 212A is defined, and an angle CJ2 between the side surface S8J2 and the extension direction E1 of the substrate 212A is defined. Each of the angle CJ1 and the angle CJ2 ranges from 1 degree to 60 degrees, which should however not be construed as a limitation in the disclosure. The angle CJ1 and the angle CJ2 may be the same or different from each other. There is a cover layer 816J at the region of the angle CJ1 between the extension direction E1 and the side surface S8J1 and at the region of the angle CJ2 between the extension direction E1 and the side surface S8J2, so as to constitute two positive chamfer structures at the second side surface S8J.

Figure 12:
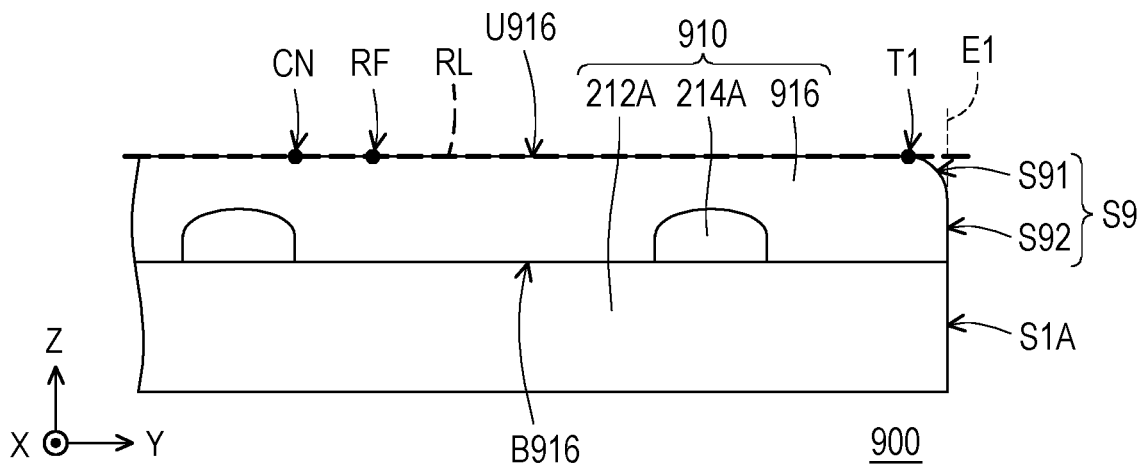
FIG. 12 is a schematic view of a portion of an electronic device according to an embodiment of the disclosure.

FIG. 12 is a schematic view of a portion of an electronic device according to an embodiment of the disclosure. An electronic device 900 includes an electronic unit 910, wherein electronic unit 910 includes the substrate 212A, the semiconductor components 214A, and a cover layer 916. How the semiconductor components 214A are disposed between the substrate 212A and the cover layer 916 may be derived from the description provided in the previous embodiments. In this embodiment, the substrate 212A has the first side surface S1A, the cover layer 916 has a second side surface S9, and the second side surface S9 has an R-angle structure. The cover layer 916 may be a variation of the cover layer 716 in FIG. 10, wherein the second side surface S9 in FIG. 10 is an implementation manner where the second side surface S8 in FIG. 8 is modified to have a chamfer. In some embodiments, in the second side surface S8A to the second side surface S8J, the side surfaces inclined relative to the extension direction E1 of the substrate 212A as provided in the previous embodiments (e.g., any of the second side surface S8A, the side surface S8B1, the second side surface S8C, the side surface S8D2, the side surface S8E1, the side surface S8E2, the side surface S8F1 and the side surface S8F2, the second side surface S8G, the side surface S8H1, the side surface S8H2, the side surface S8I1, the side surface S8I2, the side surface S8J1, and the side surface S8J2) may be modified to have an arc shape, so as to constitute the R-angle structure at the second side surface S8A to the second side surface S8J. When any of the second side surface S8A, the side surface S8B1, the second side surface S8C, the side surface S8D2, the side surface S8E1, the side surface S8E2, the side surface S8F1 and the side surface S8F2, the second side surface S8G, the side surface S8H1, the side surface S8H2, the side surface S8I1, the side surface S8I2, the side surface S8J1, and the side surface S8J2 is modified to have the arc shape, the side surface may have a concave or convex arc-shaped surface in comparison with the side surface of a linear shape.

Specifically, as shown in FIG. 12, the cover layer 916 has an upper surface U916, a lower surface B916, and a second side surface S9 connected between the upper surface U916 and the lower surface B916. The first side surface S1A of the substrate 212A has the extension direction E1, and the R-angle structure has a third side surface S91 which is not parallel to the extension direction E1 and a fourth side surface S92 which is parallel to the extension direction E1. The third side surface S91 is closer to the upper surface U916, and the fourth side surface S92 is closer to the lower surface B916. The third side surface S91 has an arc shape in the cross-sectional structure, so as to define the R-angle structure. In this embodiment, the area of the third side surface S91 may be greater than 10% of the sum of an area of the third side surface S91 and an area of the fourth side surface S92. In some embodiments, the area of the fourth side surface S92 may be 0; that is, the R-angle structure may be constituted by the arc-shaped third side surface S91. In addition, in this embodiment, the area of the third side surface S91 and the area of the fourth side surface S92 may be measured with reference to the method depicted in FIG. 10.

In some embodiments, an end point T1 of the arc-shaped third side surface S91 close to the upper surface U916 may be defined in the following manner. First, in the cross-sectional structure, a reference point RF is selected from a center point CN of the electronic unit 910 arbitrarily shifted by about 10 millimeters (mm) along the Y axis (toward the left side or the right side of the figure). Next, a reference line RL (the dashed line in FIG. 12) is taken, where the reference line RL is defined by the average height of the center point CN and the reference point RF and is parallel to the Y axis. The end point T1 of the third side surface S91 close to the upper surface U916 may be a point where the arc-shaped profile of the third side surface S91 and the reference line RL are intersected. In some embodiments, the center point CN of the electronic unit 910 may be horizontally shifted by about 10 mm along the Y axis toward the left side and the right side of the figure, so as to select two reference points RF, and then the reference line RL is defined by the average height of the two reference points RF and the center point CN. In some embodiments, two reference points RF may be selected from the center point CN of the electronic unit 910 horizontally shifted by about 10 mm along the Y axis toward the left side and the right side of the figure, and then another two reference points RF may be selected from the center point CN of the electronic unit 910 horizontally shifted by about 20 mm along the Y axis toward the left side and the right side of the figure to select, and the reference line RL is defined by the average height of the four reference points RF and the center point CN. Here, the reference line RL may be parallel to the Y-axis direction. In some embodiments, the curvature radius of the third side surface S91 may be 0.1 to 1000 times the distance between the reference line RL and the lower surface B916; here, the distance between the reference line RL and the lower surface B916 may also be regarded as the thickness of the cover layer 916.

From the embodiments depicted in FIG. 10 to FIG. 12, the cover layers 816, 816A to 816J, and 916 have the chamfer structure or the R-angle structure at the second side surface, so as to refract the transmission path of light. Hence, the light emitting uniformity of the electronic devices 800, 800A to 800J, and 900 may be improved by the chamfer structure or the R-angle structure. When applied to a product formed by splicing the electronic devices, the adjacent spliced electronic device 800, 800A to 800J, or 900 may provide a uniform brightness distribution, which is conducive to improvement of the display quality of the product. In addition, the electronic devices 800, 800A to 800J, and 900 depicted in FIG. 10 to FIG. 12 may further include a functional unit disposed on at least one of the first side surface and the second side surface, e.g., the functional unit illustrated in any of FIG. 3A to FIG. 3F, FIG. 4A to FIG. 4F, FIG. 5A to FIG. 5F, FIG. 6A to FIG. 6F, and FIG. 7. In some embodiments, the functional unit may surround a plurality of side surfaces of at least one of the substrate and the cover layer. In some embodiments, the functional unit may fully or incompletely cover at least one of the side surfaces of at least one of the substrate and the cover layer. In addition, the edge of the functional unit may have a right angle, a C-shaped chamfer, an R angle, an arc-shaped structure, an irregular shape, and so forth.

To sum up, the electronic device provided in one or more embodiments of the disclosure may include the functional unit disposed on the side surface, so as to improve the light emitting uniformity of the electronic device. In addition, the functional unit on the side surface of the electronic device may partially cover or completely cover the side surface, so as to provide various implementations. In some embodiments, at least one of the substrate and the cover layer of the electronic device may have the chamfer structure, the R-angle structure, and so on, and these structures may change the transmission path of light and may be conducive to improvement of the light emitting uniformity of the electronic device.

Finally, it should be noted that the above embodiments merely serve to illustrate the technical schemes of the disclosure rather than limiting the disclosure. Although the disclosure has been described in detail with reference to the foregoing embodiments, those of ordinary skill in the pertinent art should understand that it is possible to modify the technical schemes described in the foregoing embodiments or equivalently replace some or all of the technical features; and these modifications or replacements do not make the nature of the corresponding technical schemes deviate from the technical schemes of the embodiments provided in the disclosure.

What is claimed is:

1. An electronic device, comprising:
an electronic unit, comprising:
a substrate, having a plurality of first side surfaces;
a plurality of semiconductor components, disposed on the substrate; and
a cover layer, disposed on the semiconductor components and having an upper surface, a lower surface, and a plurality of second side surfaces; and
a functional unit, disposed on at least one of at least one of the first side surfaces and at least one of the second side surfaces, wherein a thickness of the functional unit close to the upper surface is less than the thickness of the functional layer close to the lower surface.

2. The electronic device according to claim 1, wherein the functional unit comprises an anti-static layer.

3. The electronic device according to claim 1, wherein the functional unit comprises a light modulation layer.

4. The electronic device according to claim 1, wherein the functional unit comprises an anti-static layer and a light modulation layer.

5. The electronic device according to claim 4, wherein the anti-static layer is disposed between the electronic unit and the light modulation layer.

6. The electronic device according to claim 4, wherein the light modulation layer is disposed between the electronic unit and the and the anti-static layer.

7. The electronic device according to claim 1, wherein the functional unit is in contact with the at least one of the at least one of the first side surfaces and the at least one of the second side surfaces.

8. The electronic device according to claim 1, wherein the functional unit comprises a light modulation component disposed between the substrate and the cover layer and located on the at least one of the second side surfaces.

9. The electronic device according to claim 1, further comprising a back plate disposed below the electronic unit and having a sectional difference.

10. The electronic device according to claim 9, wherein the back plate has a first surface, a second surface, and a side surface between the first surface and the second surface to form the sectional difference, and the side surface and at least one portion of the functional unit are overlapped in a thickness direction of the back plate.

11. The electronic device according to claim 1, wherein a cross-sectional structure of the first side surfaces of the substrate has a right angle, a C-shaped chamfer, an R angle, an arc-shaped profile, a regular shape, or an irregular shape.

12. An electronic device, comprising:
an electronic unit, comprising:
a substrate, having a plurality of first side surfaces;
a plurality of semiconductor components, disposed on the substrate; and
a cover layer, disposed on the semiconductor components and having a plurality of second side surfaces, wherein at least one of the second side surfaces has a chamfer structure.

13. The electronic device according to claim 12, wherein the first side surfaces have an extension direction, and the chamfer structure has a third side surface not parallel to the extension direction, wherein an angle between the extension direction and the third side surface is defined, and the angle ranges from 1 degree to 60 degrees.

14. The electronic device according to claim 12, wherein the chamfer structure is a negative chamfer structure.

15. The electronic device according to claim 12, wherein the chamfer structure is a positive chamfer structure.

16. The electronic device according to claim 12, wherein the first side surfaces have an extension direction, the chamfer structure has a third side surface not parallel to the extension direction and a fourth side surface parallel to the extension direction, and an area of the third side surface is greater than about 10% of a sum of the area of the third side surface and an area of the fourth side surface.

17. The electronic device according to claim 12, further comprising a functional unit disposed on at least one of at least one of the first side surfaces and the at least one of the second side surfaces.

18. The electronic device according to claim 12, wherein a cross-sectional structure of the first side surfaces of the substrate has a right angle, a C-shaped chamfer, an R angle, an arc-shaped profile, a regular shape, or an irregular shape.

19. The electronic device according to claim 12, further comprising a back plate disposed below the electronic unit and having a sectional difference.

* * * * *